United States Patent
Tischler et al.

(10) Patent No.: US 9,224,934 B2
(45) Date of Patent: *Dec. 29, 2015

(54) STRESS RELIEF FOR ARRAY-BASED ELECTRONIC DEVICES

(71) Applicants: Michael A. Tischler, Vancouver (CA); Paul Palfreyman, Vancouver (CA); Philippe M. Schick, Vancouver (CA)

(72) Inventors: Michael A. Tischler, Vancouver (CA); Paul Palfreyman, Vancouver (CA); Philippe M. Schick, Vancouver (CA)

(73) Assignee: Cooledge Lighting, Inc., Richmond (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/491,423

(22) Filed: Sep. 19, 2014

(65) Prior Publication Data

US 2015/0008460 A1 Jan. 8, 2015

Related U.S. Application Data

(63) Continuation of application No. 13/964,737, filed on Aug. 12, 2013, now Pat. No. 8,928,014.

(60) Provisional application No. 61/788,980, filed on Mar. 15, 2013.

(51) Int. Cl.
*H01L 33/00* (2010.01)
*H01L 33/62* (2010.01)
*H01L 25/075* (2006.01)
*H01L 25/13* (2006.01)
*H01L 33/38* (2010.01)

(52) U.S. Cl.
CPC ............ *H01L 33/62* (2013.01); *H01L 25/0753* (2013.01); *H01L 25/13* (2013.01); *H01L 33/38* (2013.01); *H01L 2224/16225* (2013.01); *H01L 2924/07811* (2013.01)

(58) Field of Classification Search
CPC ......... H01L 25/13; H01L 33/62; H01L 33/38; H01L 25/0753; H01L 2924/07811; H01L 2224/16225
See application file for complete search history.

(56) References Cited

U.S. PATENT DOCUMENTS

| | | | |
|---|---|---|---|
| 8,324,718 B2 | 12/2012 | Honda | |
| 8,384,121 B2 | 2/2013 | Tischler et al. | |
| 2002/0089064 A1 | 7/2002 | Wu | |
| 2005/0247944 A1* | 11/2005 | Haque et al. | 257/79 |
| 2006/0097051 A1 | 5/2006 | Foo et al. | |
| 2006/0175986 A1 | 8/2006 | Lee et al. | |

(Continued)

FOREIGN PATENT DOCUMENTS

| | | | |
|---|---|---|---|
| EP | 2067501 A2 | | 6/2009 |
| WO | WO2012008253 | * | 1/2012 |

OTHER PUBLICATIONS

International Search Report and Written Opinion mailed Jul. 21, 2014 for International Application No. PCT/IB2014/000844 (12 pages).

*Primary Examiner* — Su C Kim
(74) *Attorney, Agent, or Firm* — Morgan, Lewis & Bockius LLP

(57) ABSTRACT

In accordance with certain embodiments, an electric device includes a flexible substrate having first and second conductive traces on a first surface thereof and separated by a gap therebetween, an electronic component spanning the gap, and a stiffener configured to substantially prevent flexing of the substrate proximate the gap during flexing of the substrate.

15 Claims, 9 Drawing Sheets

(56) References Cited

U.S. PATENT DOCUMENTS

| | | | |
|---|---|---|---|
| 2008/0012035 A1* | 1/2008 | Wang et al. | 257/99 |
| 2008/0198299 A1* | 8/2008 | Choi et al. | 349/68 |
| 2009/0278151 A1 | 11/2009 | Kim | |
| 2011/0121756 A1* | 5/2011 | Thomas et al. | 315/294 |
| 2012/0002420 A1 | 1/2012 | Imai et al. | |
| 2012/0175660 A1 | 7/2012 | Namiki et al. | |
| 2013/0168708 A1* | 7/2013 | Shibata et al. | 257/88 |

* cited by examiner

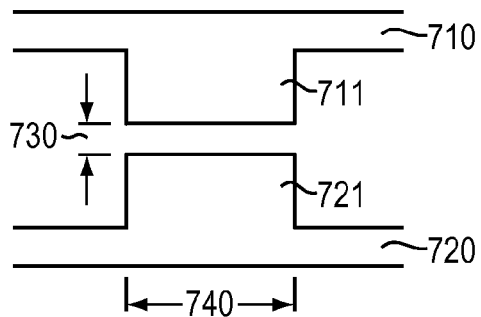
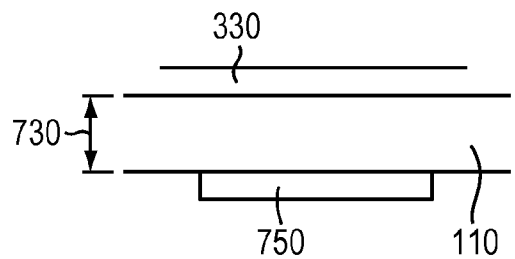
FIG. 7A   FIG. 7B
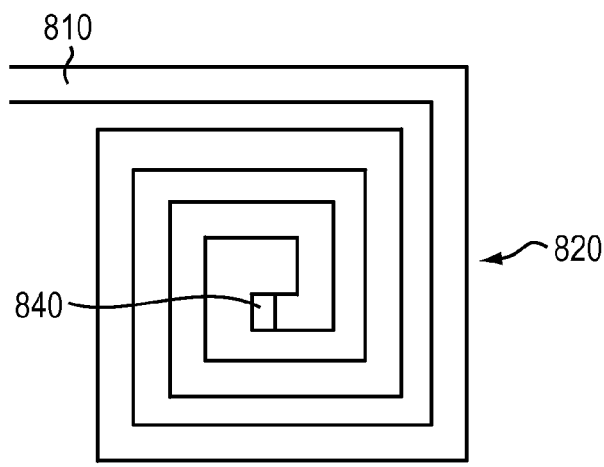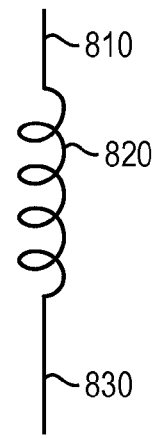
FIG. 8A   FIG. 8B
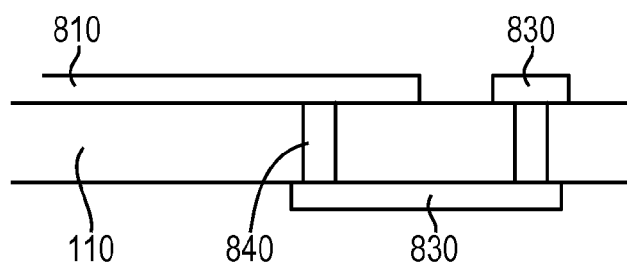
FIG. 8C
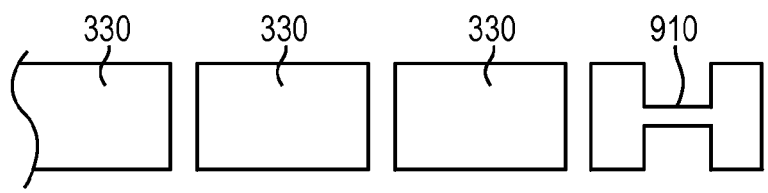
FIG. 9

STRESS RELIEF FOR ARRAY-BASED ELECTRONIC DEVICES

RELATED APPLICATION

This application is a continuation of U.S. patent application Ser. No. 13/964,737, filed Aug. 12, 2013, which claims the benefit of and priority to U.S. Provisional Patent Application No. 61/788,980, filed Mar. 15, 2013, the entire disclosure of each of which is incorporated herein by reference.

FIELD OF THE INVENTION

In various embodiments, the present invention generally relates to electronic devices, and more specifically to array-based electronic devices.

BACKGROUND

Light sources such as light-emitting diodes (LEDs) are an attractive alternative to incandescent and fluorescent light bulbs in illumination devices due to their higher efficiency, smaller form factor, longer lifetime, and enhanced mechanical robustness. Such systems typically have multiple LEDs, and optionally other passive or active components, mounted on a printed circuit or wiring board. The printed circuit board may be fiberglass, such as FR4, or, for cases in which higher heat loads must be managed, a metal core printed circuit board (MCPCB). The cost of these systems must be reduced and the reliability improved in order to drive increased market penetration. In order to reduce cost, some systems have utilized low-cost plastic substrates. Such systems may feature conductive traces formed over the plastic substrate (e.g., a plastic wiring board) interconnecting a large array of packaged or unpackaged LEDs. In some cases the plastic substrate is flexible. Such systems have been described in U.S. patent application Ser. No. 13/171,973, filed on Jun. 29, 2011 (the '973 application), the entire disclosure of which is incorporated herein by reference.

One challenge for systems based on plastic substrates is the reduction of mechanical stress on the components mounted on the circuit board. Mechanical stress may cause the joint between the component and the circuit board to weaken or fail, resulting in reduced performance or, in some cases, partial or complete system failure. Mechanical stress may arise from a number of sources, including but not limited to flexure of the substrate and thermal cycles. Thermally induced mechanical stress may arise from, for example, changes in ambient temperature or device self-heating during operation and/or power cycling. Stress reduction is of particular importance for flexible substrates both in operation and during manufacture, where in some cases roll-to-roll manufacture may be contemplated. Broadly stated, stress may arise during manufacture, shipping, operation and/or one or more other stages of the life of a system.

In view of the foregoing, a need exists for systems and techniques enabling the low-cost design and manufacture of reliable array-based lighting systems capable of supporting a large number of different products and having a cost-effective drive and interconnect system. Such lighting systems should preferably also be uniform, reliable, large-area, and low-cost.

SUMMARY

In accordance with certain embodiments, lighting systems are fabricated utilizing discrete lightsheets fabricated on flexible substrates that typically include conductive traces interconnecting large arrays of light-emitting elements (LEEs) and control elements, which govern or affect operation of the LEEs. Control elements may include one or more passive components, such as resistors, capacitors, inductors, or fuses, as well as active components, e.g., transistors and diodes. Advantageously, stress on components may be reduced by replacing a discrete component with a "distributed" component—i.e., eliminating the discrete component itself but retaining its function by varying the properties of one or more existing elements; the discrete component's function, in other words, is distributed among other components. The geometry and construction of a lightsheet and its components may also be engineered to reduce stress on components such as LEEs. All or some of one or more active control elements or one or more passive control elements may be formed in a distributed fashion, using the electrical and mechanical properties of the conductive traces and/or the substrate.

In accordance with various embodiments of the invention, lighting systems are fabricated utilizing discrete lightsheets that may be tiled (i.e., joined along facing edges) in one or more directions. Such lightsheets typically include multiple strings of series-connected LEEs and a control element electrically connected to each string. Each string may include multiple conductive elements interconnecting LEEs and control elements. Advantageously, the pitch between strings and/or LEEs may be constant across single lightsheets or even across multiple joined (i.e., tiled) lightsheets, notwithstanding the joints between the lightsheets. Thus, lighting systems in accordance with embodiments of the present invention may have arbitrary sizes but have a consistent appearance (e.g., luminance of emitted light) across their entire areas. The control elements may be present on the lightsheets within or between strings of LEEs so as not to interrupt the LEE pitch. Similarly, larger lightsheets may be segmented into smaller lightsheets (e.g., by separation between two strings of LEEs) while still maintaining full functionality of each smaller segment. Power may be supplied to the LEEs via power conductors located on, e.g., one or more edges or sides of the lightsheets. The layout of the conductive elements and the interaction between multiple conductive elements, between one or more conductive elements and one or more power conductors, and between conductive elements and the substrate may be modified to form distributed passive components including or consisting essentially of resistors, capacitors, inductors, and/or fuses. Additional details of lightsheets and lighting systems in accordance with embodiments of the present invention appear within U.S. patent application Ser. No. 13/799,807, filed Mar. 13, 2013, the entire disclosure of which is incorporated by reference herein.

Various embodiments of the invention feature a lighting system including or consisting essentially of a substantially planar lightsheet, first and second spaced-apart power conductors disposed on the lightsheet, a plurality of light-emitting strings, and a plurality of control elements. Each light-emitting string may (i) include or consist essentially of a plurality of conductive elements interconnecting light-emitting elements spaced along the light-emitting string, (ii) have a first end electrically coupled to the first power conductor, and (iii) have a second end electrically coupled to the second power conductor. The power conductors supply power to each of the light-emitting strings. Each control element may be (i) electrically connected to at least one light-emitting string through one or more conductive elements and (ii) configured to utilize power supplied from the power conductors to control power (e.g., supply a substantially constant current) to the light-emitting string(s) to which it is electrically connected. Each conductive element may include or consist essentially of at least one passive component, such as a resistor, inductor, capacitor or fuse and/or one or more active components, such as a transistor or diode or integrated circuit.

In various embodiments of the present invention, resistors may be composed of one or more conductive elements, and their resistance values may be determined by the resistivity and geometry of the conductor or conductors. Similarly, an inductor may be composed of one or more conductive elements, and its inductance value may be determined by the geometry of the conductor or conductors. Moreover, a capacitor may be formed between all or portions of two adjacent conductive traces or between all or portions of a conductive trace and a power conductor or between all or portions of a conductive trace and a separate conductor. Capacitors may also be formed between all or portions of a conductor on one side of the substrate and all or portions of a conductor on the opposite side of the substrate, such that the substrate is disposed between the two conductors. Such conductors may be entire or portions of conductive elements, power conductors, or other conductors. Their capacitance values may be determined by the geometry of the conductor or conductors.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of LEEs include solid-state, organic, polymer, phosphor-coated or high-flux LEDs, microLEDs (described below), laser diodes or other similar devices as would be readily understood. The emitted radiation of a LEE may be visible, such as red, blue or green, or invisible, such as infrared or ultraviolet. A LEE may produce radiation of a spread of wavelengths. A LEE may feature a phosphorescent or fluorescent material for converting a portion of its emissions from one set of wavelengths to another. A LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

An LEE may be of any size. In some embodiments, an LEE has one lateral dimension less than 500 μm, while in other embodiments an LEE has one lateral dimension greater than 500 μm. Exemplary sizes of a relatively small LEE may include about 175 μm by about 250 μm, about 250 μm by about 400 μm, about 250 μm by about 300 μm, or about 225 μm by about 175 μm. Exemplary sizes of a relatively large LEE may include about 1000 μm by about 1000 μm, about 500 μm by about 500 μm, about 250 μm by about 600 μm, or about 1500 μm by about 1500 μm. In some embodiments, an LEE includes or consists essentially of a small LED die, also referred to as a "microLED." A microLED generally has one lateral dimension less than about 300 μm. In some embodiments, the LEE has one lateral dimension less than about 200 μm or even less than about 100 μm. For example, a microLED may have a size of about 225 μm by about 175 μm or about 150 μm by about 100 μm or about 150 μm by about 50 μm. In some embodiments, the surface area of the top surface of a microLED is less than 50,000 μm$^2$ or less than 10,000 μm$^2$. The size of the LEE is not a limitation of the present invention, and in other embodiments the LEE may be relatively larger, e.g., the LEE may have one lateral dimension on the order of at least about 1000 μm or at least about 3000 μm. In some embodiments the LEE may emit white light or substantially white light.

In some embodiments, various elements such as substrates or lightsheets are "flexible" in the sense of being pliant in response to a force and resilient, i.e., tending to elastically resume an original configuration upon removal of the force. Such elements may have a radius of curvature of about 1 m or less, or about 0.5 m or less, or even about 0.1 m or less. In some embodiments, flexible elements have a Young's Modulus less than about 100 N/m$^2$, less than about 50 N/m$^2$, or even less than about 10 N/m$^2$. In some embodiments, flexible elements have a Shore A hardness value less than about 100; a Shore D hardness less than about 100; and/or a Rockwell hardness less than about 150.

In an aspect, embodiments of the invention feature an electronic device including or consisting essentially of a flexible substrate, a light-emitting diode, and a stiffener. The flexible substrate has first and second conductive traces on a first surface thereof, and the first and second conductive traces are separated on the substrate by a gap therebetween. The light-emitting diode has first and second distinct contacts on a first surface thereof, and the first and second contacts are attached to and in electrical contact with, respectively, the first and second conductive traces. The stiffener is distinct from the substrate, spans the gap, and is configured to substantially prevent flexing of the substrate at the gap during flexing of the substrate. (By "spanning the gap" is meant extending along the substrate over, within, beneath (e.g., on the opposite side of the substrate from), and/or alongside the gap; thus, the stiffener need not be in contact with elements within and/or defining the gap, but may merely cross the region of the gap alongside the gap.)

Embodiments of the invention may include one or more of the following in any of a variety of different combinations. The light-emitting diode may be a bare-die light-emitting diode or a packaged light-emitting diode. The stiffener may be substantially transparent to a wavelength of light emitted by the light-emitting diode. The first conductive trace may include or consist essentially of (i) a first portion comprising at least one protrusion extending into the gap and (ii) a second portion extending substantially linearly away from the gap, the first portion of the first conductive trace being disposed between at least a portion of the gap and the second portion of the first conductive trace. The second conductive trace may include or consist essentially of (i) a first portion comprising at least one protrusion extending into the gap and (ii) a second portion extending substantially linearly away from the gap, the first portion of the second conductive trace being disposed between at least a portion of the gap and the second portion of the second conductive trace. The first portion of the first conductive trace may be a substantial mirror image of the first portion of the second conductive trace. The stiffener may include or consist essentially of the first portions of the first and second conductive traces.

The gap may extend along a serpentine path, and the stiffener may include or consist essentially of a portion of the first conductive trace (a) proximate the gap and (b) having at least one protrusion that at least partially defines the serpentine path of the gap. Opposite the protrusion, the second conductive trace may have a shape complementary to the protrusion such that a width of the gap is substantially constant along an entire length of the gap. The width of the protrusion may be less than 25% of a width of the first conductive trace away from the protrusion. The first surface of the light-emitting diode may be substantially rectangular with a long axis. The first and second contacts may be disposed at opposite ends of the first surface along the long axis. The first and second conductive traces may extend away from the gap in a first direction. The light-emitting diode may be oriented such that the long axis of the first surface of the light-emitting diode is substantially parallel to the first direction. The light-emitting diode may be oriented such that the long axis of the first surface of the light-emitting diode is not parallel (e.g., substantially perpendicular) to the first direction. The first conductive trace may include or consist essentially of a first portion extending along a serpentine path proximate the gap, and a second portion extending substantially linearly away from the gap, the first portion of the first conductive trace being disposed between the gap and the second portion of the first conductive trace. The stiffener may include or consist essentially of the first portion of the first conductive trace.

The stiffener may include or consist essentially of a layer disposed over the first surface of the substrate. The stiffener may be disposed over at least a portion of the first and/or second conductive trace. The stiffener may cover the entirety of the light-emitting diode and may be in contact with, proximate the light-emitting diode, (i) the substrate, (ii) the first conductive trace, and/or (iii) the second conductive trace. The stiffener may cover the light-emitting diode substantially conformally or substantially non-conformally. The stiffener may include or consist essentially of a layer disposed over a second surface of the substrate opposite the first surface of the substrate. The stiffener may include or consist essentially of polyethylene naphthalate, polyethylene terephthalate, epoxy, FR4, fiberglass, silicon, polycarbonate, polyethersulfone, polyester, polyimide, polyethylene, copper, aluminum, silver, carbon, acrylic, and/or silicone. The stiffener may include or consist essentially of metal, plastic, and/or potting compound. The substrate and the stiffener may include or consist essentially of the same material. The first and second contacts may be attached to the first and second conductive traces with an adhesive, e.g., a pressure-activated adhesive, an anisotropic conductive adhesive, a conductive adhesive, a non-conductive adhesive, a heat-activated adhesive, and/or a UV-activated adhesive. The first and second contacts may be attached to the first and second conductive traces with solder. The first and second conductive traces may include or consist essentially of aluminum, copper, gold, silver, carbon, silver ink, and/or chromium.

The light-emitting diode may be part of one of a plurality of light-emitting strings disposed on the first surface of the substrate and interconnected in an electric circuit, each light-emitting string including (a) a plurality of light-emitting diodes spaced along the light-emitting string and (b) a plurality of electrical conductors interconnecting the light-emitting diodes. The electric circuit may include one or more passive components. At least one passive component of the electric circuit may be a distributed component having a selected electrical response to current passing therethrough. The distributed component may correspond to a portion of an electrical conductor and/or a portion of the substrate. The selected electrical response may be a target resistance and the distributed component may be a resistor consisting essentially of a first portion of an electrical conductor connecting a light-emitting diode with a discrete electrical component and having (i) a thickness different from a thickness of a second portion of the electrical conductor different from the first portion, the different thickness imparting the target resistance, and/or (ii) a width different from a width of a second portion of the electrical conductor different from the first portion, the different width imparting the target resistance. The selected electrical response may be a target inductance and the distributed component may be an inductor consisting essentially of at least a portion of an electrical conductor connecting a light-emitting diode with a discrete electrical component. The inductor may have a spiral configuration.

The discrete electrical component may be, e.g., another light-emitting diode or a bus line (or portion thereof) supplying power to the electric circuit.

The light-emitting diode may be part of one of a plurality of light-emitting strings disposed on the first surface of the substrate and interconnected in an electric circuit, each light-emitting string including (a) a plurality of light-emitting diodes spaced along the light-emitting string and (b) a plurality of electrical conductors interconnecting the light-emitting diodes. The electric circuit may include one or more passive components. At least one passive component of the electric circuit may be a distributed capacitor having a selected target capacitance in response to current passing therethrough. The distributed capacitor may have a structure corresponding to (i) a portion of an electrical conductor, (ii) a portion of a second electrical conductor proximate the electrical conductor, and (iii) a gap between the portion of the electrical conductor and the portion of the second electrical conductor, where the electrical conductor connects a light-emitting diode with a discrete electrical component and the structure imparts the target capacitance.

The light-emitting diode may be part of one of a plurality of light-emitting strings disposed on the first surface of the substrate and interconnected in an electric circuit, each light-emitting string including (a) a plurality of light-emitting diodes spaced along the light-emitting string and (b) a plurality of electrical conductors interconnecting the light-emitting diodes. The electric circuit may include one or more passive components. At least one passive component of the electric circuit may be a distributed capacitor having a selected target capacitance in response to current passing therethrough. The distributed capacitor may have a structure corresponding to (i) a portion of an electrical conductor, (ii) a portion of the substrate underlying the portion of the electrical conductor, and (iii) a conductive layer underlying the electrical conductor and disposed over a second surface of the substrate opposite the first surface, where the electrical conductor connects a light-emitting diode with a discrete electrical component and the structure imparts the target capacitance. The discrete electrical component may be, e.g., another light-emitting diode or a bus line (or portion thereof) supplying power to the electric circuit.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Embodiments described herein that incorporate light-emitting diodes or other light-emitting elements may be implemented with other electronic components instead of or in addition to the light-emitting elements, unless otherwise indicated. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the terms "substantially," "approximately," and "about" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 7A and 7B are schematic illustrations of capacitive structures in accordance with various embodiments of the invention;

FIGS. 8A-8C are schematic illustrations of inductive structures in accordance with various embodiments of the invention;

FIG. 9 is a schematic illustration of a fuse element in accordance with various embodiments of the invention;

DETAILED DESCRIPTION

Figure 1A:
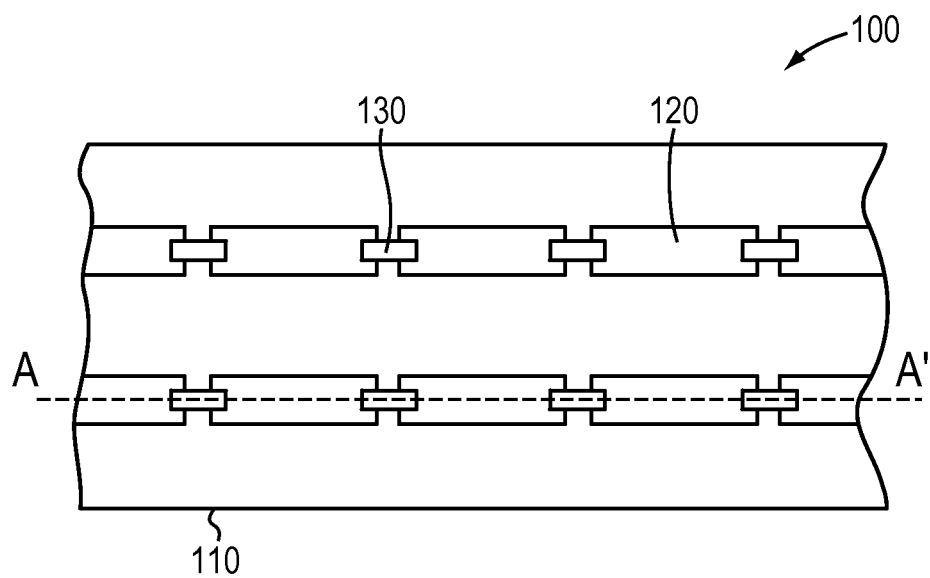
FIGS. 1A and 1B are schematic plan and cross-section views, respectively, of a lightsheet in accordance with various embodiments of the invention.
Figure 1B:
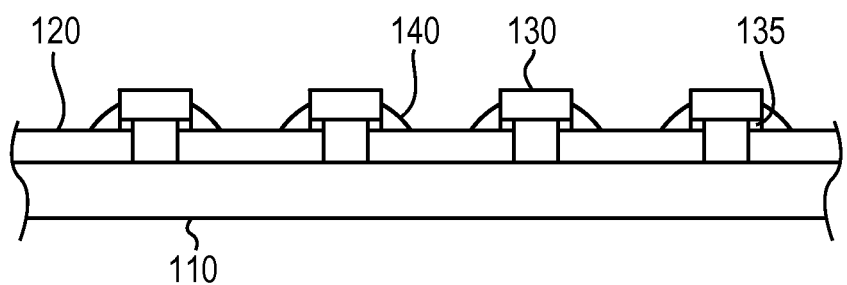

FIG. 1A is a plan view of a lightsheet 100, and FIG. 1B is a cross-sectional view of lightsheet 100 through cut-line A-A'. Lightsheet 100 includes or consists essentially of a substrate 110 over which are formed conductive traces 120. FIG. 1A shows one component 130 attached to conductive traces 120; however, more than one component 130 may be used in preferred embodiments. Each component 130 may include or consist essentially of an LEE or other active or passive component, such as a transistor, resistor, capacitor, inductor, diode, etc. In FIGS. 1A and 1B, component 130 has two contacts 135 that are electrically coupled to conductive traces 120 using an adhesive 140. In some embodiments, adhesive 140 includes or consists essentially of an anisotropic conductive adhesive (ACA); however, the method of electrically coupling contacts 135 to conductive traces 120 is not a limitation of the present invention. In some embodiments, adhesive 140 may also mechanically attach component 130 to substrate 110 and/or conductive traces 120. In some embodiments, component 130 may have more than two contacts 135.

Substrates 110 may be composed of a wide range of materials. In some embodiments, substrates 110 have relatively low thermal conductivities, whereas in other embodiments, substrates 110 have relatively high thermal conductivities. In some embodiments, substrates 110 are flexible, while in others they are substantially rigid. Substrate 110 may include or consist essentially of a semicrystalline or amorphous material, e.g., polyethylene naphthalate (PEN), polyethylene terephthalate (PET), or FR4 (i.e., a glass-reinforced epoxy laminate), fiberglass, silicon, glass, polycarbonate, polyethersulfone, polyester, polyimide, polyethylene, and/or paper. Substrate 110 may include or consist essentially of multiple layers, e.g., a deformable layer over a rigid layer, for example, a semicrystalline or amorphous material, e.g., PEN, PET, polycarbonate, polyethersulfone, polyester, polyimide, polyethylene, and/or paper formed over a rigid substrate comprising, e.g., acrylic, aluminum, steel, and the like. Depending upon the desired application for which embodiments of the invention are utilized, substrate 110 may be substantially optically transparent, translucent, or opaque. For example, substrate 110 may exhibit a transmittance or a reflectivity greater than 70% for optical wavelengths ranging between approximately 400 nm and approximately 700 nm. In some embodiments, substrate 110 may exhibit a transmittance or a reflectivity of greater than 70% for one or more wavelengths emitted by LEE 130. Substrate 110 may also be substantially insulating, and may have an electrical resistivity greater than approximately 100 ohm-cm, greater than approximately $1 \times 10^6$ ohm-cm, or even greater than approximately $1 \times 10^{10}$ ohm-cm. In some embodiments, substrate 110 may include or consist essentially of materials such as fiberglass, FR4, metal, ceramic materials such as silicon carbide, aluminum nitride, aluminum oxide, combinations of these materials, and the like. In some embodiments, substrate 110 may include or consist essentially of a metal core printed circuit board.

Conductive elements 120, also referred to herein as conductive traces, may be formed via conventional deposition, photolithography, and etching processes, plating processes, lamination, lamination and patterning, evaporation sputtering, chemical vapor deposition or the like or may be formed using a variety of printing processes. For example, conductive elements 120 may be formed via screen printing, flexographic printing, ink-jet printing, and/or gravure printing. Conductive elements 120 may include or consist essentially of a conductive ink, which may include one or more elements such as silver, gold, aluminum, chromium, copper, and/or carbon. Conductive elements 120 may include or consist essentially of a conductive material, which may include one or more elements such as silver, gold, aluminum, chromium, copper, and/or carbon. Conductive elements 120 may have a thickness in the range of about 50 nm to about 500 µm. In some embodiments, all or a portion of conductive elements 120 may be covered or encapsulated. In some embodiments, a layer of material, for example insulating material, may be formed over all or a portion of conductive elements 120. Such a material may include or consist essentially of, for example, the same material as used for substrate 165, for example in sheet form, a printed layer, for example using screen, ink jet, stencil or other printing techniques, a laminated layer, or the like. Such a laminated layer may include or consist essentially of, for example, an ink, a plastic and oxide or the like. The covering material and/or the method by which it is applied is not a limitation of the present invention.

In one embodiment, conductive traces 120 may be formed so as to have a gap between adjacent conductive traces 120, and LEEs 130 are electrically coupled to conductive traces 120 using solder, conductive adhesive, e.g., an isotropically conductive adhesive and/or an ACA, for example as shown in FIG. 1A and as described in the '973 application. Electrical coupling may be utilized with or without stud bumps. Embodiments of the present invention utilizing ACA are not limited by the particular mode of operation of the ACA. For example, the ACA may be pressure-activated or utilize a magnetic field rather than pressure (e.g., the ZTACH ACA available from SunRay Scientific of Mt. Laurel, N.J., for which a magnetic field is applied during curing in order to align magnetic conductive particles to form electrically conductive "columns" in the desired conduction direction). Furthermore, various embodiments utilize one or more other electrically conductive adhesives, e.g., isotropically conductive adhesives, non-conductive adhesives, in addition to or instead of one or more ACAs.

In some embodiments, the relative thicknesses and mechanical properties of substrate 110 and conductive traces 120 may at least in part determine the source of mechanical stress on the electrical and mechanical joint between component 130 and lightsheet 100. For example, under bending or flexing of lightsheet 100, if substrate 110 is relatively thin and relatively flexible or compliant, it may induce less stress than if substrate 110 is relative thicker and less flexible. Similarly, under bending or flexing of lightsheet 100, if conductive trace 120 is relatively thin and relatively flexible or compliant, it may induce less stress than if conductive trace 120 is relatively thicker and less flexible. In some embodiments, the same relationships hold for sources of stress other than bending or flexing of lightsheet 100, for example changes in ambient temperature or self-heating during operation or power cycling.

Component 130 may include or consist essentially of an LEE or one or more other active or passive components, for example a transistor, resistor, capacitor, inductor, diode, etc. Lightsheet 100 may include more than one of one or more of these types of components. In one embodiment, lightsheet 100 is a plastic substrate, for example PET, that includes or consists of a plurality of LEEs as well as a plurality of non-LEE components, for example one or more transistors and one or more passive components.

Figure 2A:
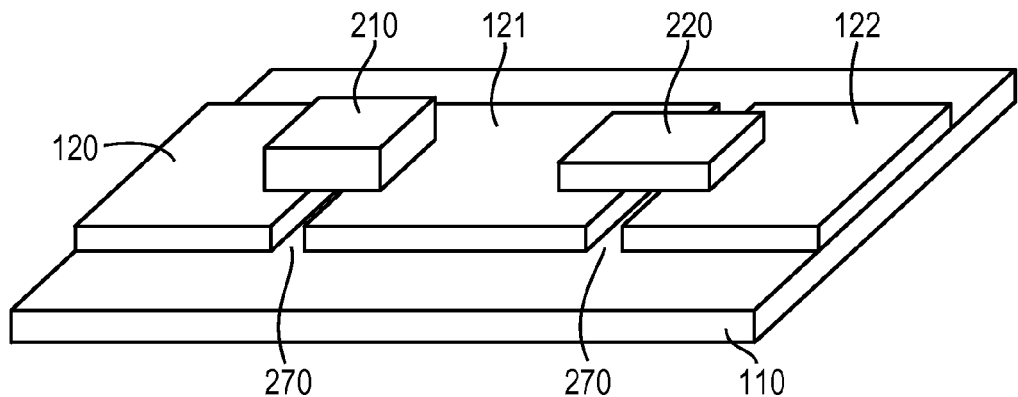
FIG. 2A is a schematic of a system including an LEE and a discrete resistor in accordance with various embodiments of the invention.

One embodiment of the present invention eliminates one or more non-LEE elements on lightsheet 100 by incorporating their functions into the geometry and electrical properties of lightsheet 100. As an example, FIG. 2A shows a portion of an exemplary schematic featuring an LEE 210 and a resistor 220. In one embodiment, LEE 210 and resistor 220 may be packaged surface mount devices (SMDs); however, this is not a limitation of the present invention, and in other embodiments LEE 210 and resistor 220 may be any type of element mounted on lightsheet 100; for example, LEE 210 may include or consist essentially of a bare semiconductor die.

Figure 2B:
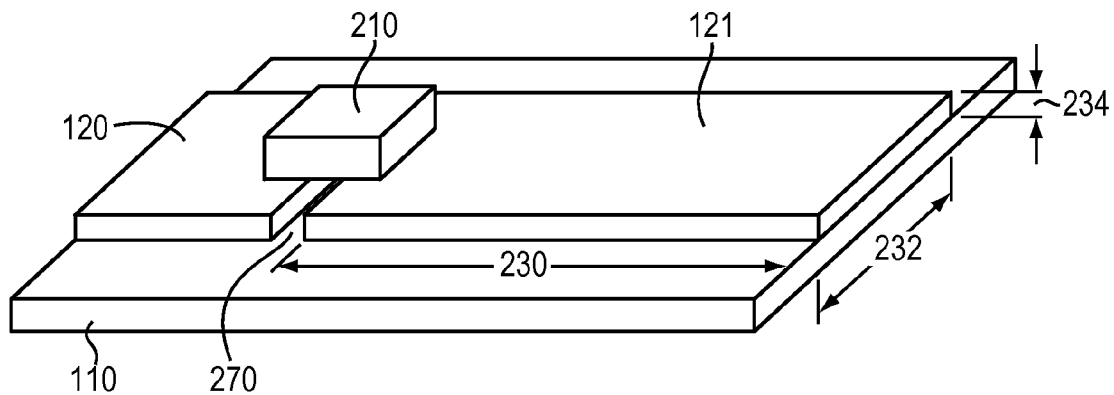
FIG. 2B is a schematic of a system including an LEE and a distributed resistor in accordance with various embodiments of the invention.

In one embodiment of the present invention, resistor 220, which is a component (e.g., an SMD packaged resistor) mounted on light sheet 100, is replaced by a distributed resistor that is formed from all or a portion of the material of conductive trace 120. FIG. 2B shows one embodiment of the present invention in which a distributed resistor replaces resistor 220 in the structure of FIG. 2A. The structure of FIG. 2A includes substrate 110, conductive traces 120, 121, 122, LEE 210, and resistor 220. LEE 210 and resistor 220 are formed over and between gaps 270 between adjacent conductive traces 120, 121 and between adjacent conductive traces 121, 122, respectively. However, the layout of conductive traces 120, 121, 122, as well as the method of attachment and electrical coupling of contacts on LEE 210 (not shown for clarity) are not limitations of the present invention, and in other embodiments conductive traces 120, 121, 122 may have any layout, or there may be a fewer or larger number of conductive traces, as will be discussed herein. Attachment and electrical coupling may be accomplished using a variety of techniques, for example soldering, wire bonding, conductive adhesive, ACA or the like; the method of attachment and electrical coupling of LEE 210 to conductive traces 120 and 121 is not a limitation of the present invention.

As shown in FIG. 2B, in one embodiment of the present invention, a discrete, interchangeable, and removable resistor 220 is replaced by a distributed resistor formed by the electrical properties of the conductive traces. For example, conductive trace 121 has a length 230, a width 232, and a thickness 234. Assuming the resistivity of conductive trace 121 is homogeneous and operation of the system at DC or relatively low frequency or low frequency AC, the resistance of conductive trace 121 may be calculated using the equation $R=\rho l/A$, where R is the resistance of conductive trace 121, $\rho$ is the resistivity of the material of conductive trace 121, l is the length 230 of conductive trace 121, and A is the cross-sectional area of conductive trace 121, i.e., the product of width 232 and thickness 234. The geometry of each of the conductive traces may be engineered to provide the desired resistance to replace discrete resistor 220, i.e., the sum of all of the resistances of all of the conductive traces in the circuit (for example conductive traces in a series, parallel, or series/parallel branch of a circuit). For operation at relatively higher frequencies or relatively high AC frequencies, the current may tend to be concentrated in the surface region of the conductor, and thus the resistance may have a different relationship to the geometry, and in some embodiments is more related to the conductor surface area than volume; however, the principle of determining the resistance as a function of geometry to calculate a distributed resistance value is similar and known to those of skill in the art without undue experimentation.

FIG. 2B shows conductive traces 120 and 121 having the same width and height; however, this is not a limitation of the present invention, and in other embodiments a portion or all of the conductive traces (or conductive trace elements) may have different dimensions, including length, width, and height. FIG. 2B shows two conductive traces 120 and 121; however, this is not a limitation of the present invention, and other embodiments may include more than two conductive traces. For the discussion above, it is assumed that each conductive trace has homogeneous electrical properties; however, this is not a limitation of the present invention, and in other embodiments one or more conductive traces may have inhomogeneous electrical properties, for example the resistivity. In one embodiment, the resistivity may vary along the length and/or width and/or height of the conductive trace. For the discussion above, it is assumed that all of the conductive traces on substrate 100 include or consist essentially of the same material; however, this is not a limitation of the present invention, and in other embodiments one or more conductive trace elements may include or consist essentially of different materials.

Figure 3A:
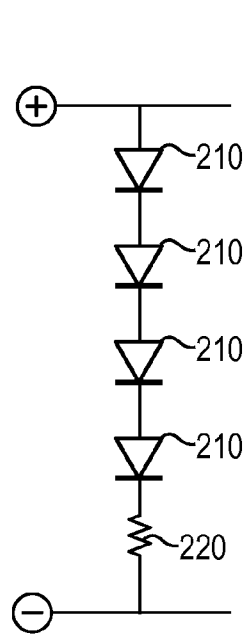
FIG. 3A is a circuit diagram of a portion of a lighting system in accordance with various embodiments of the invention.
Figure 3B:
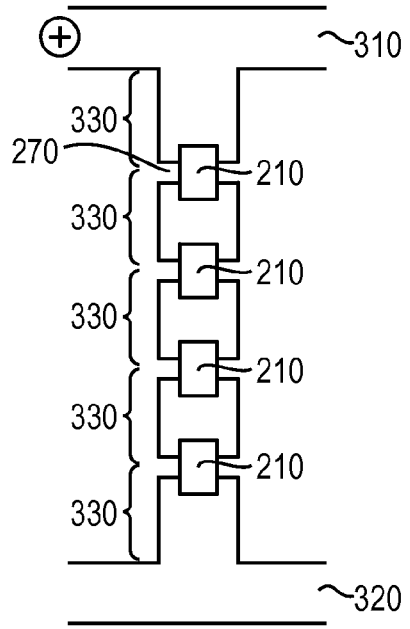
FIG. 3B is a schematic illustration of a portion of a lighting system in accordance with various embodiments of the invention.

FIG. 3A shows a schematic of a simple circuit including four LEEs 210 and a resistor 220. In some embodiments, resistor 220 may control the current flowing through the series-connected LEEs 210 when a voltage is applied across the series string of LEEs 210 and resistor 220. FIG. 3B is a plan view of a layout of a circuit in which resistor 220 is eliminated and replaced with a distributed resistor. The layout in FIG. 3B includes bus lines 310 and 320 that provide power to the circuit, conductive trace elements 330 with gaps 270 between adjacent conductive trace elements 330, and LEEs 210 electrically coupled across gaps 270 to adjacent conductive trace elements 330.

As will be understood by those skilled in the art, resistor 220 in the circuit shown in FIG. 3A may be positioned at any point in the series-connected string between the positive and negative bus lines. Analogously, the resistance produced by each of the conductive trace elements 330 in the system in FIG. 3B may be similar, substantially the same, or different. In some embodiments, the resistance may be equal or substantially equal in all of conductive trace elements 330; however, this is not a limitation of the present invention, and in other embodiments one or more conductive trace elements may individually contribute more or less resistance than other conductive trace elements 330.

In an illustrative embodiment, not meant to be limiting, each conductive trace element 330 has a width of about 0.1 cm, a length of about 0.7 cm, and a thickness of about 4 μm. The resistance of each conductive element 330 is then defined by $\rho \times 8.75 \times 10^4 \Omega$, where $\rho$ has units of Ω-cm. There are five conductive elements 330 in the layout; thus, the actual distributed resistance is given by $5 \times \rho \times 8.75 \times 10^4$ or $\rho \times 4.375 \times 10^5 \Omega$. Alternately, the calculation may be performed in terms of sheet resistance, where each conductive trace element is about 7 squares long and the resistance is given by $5 \times 7 \times R_\square$, where $R_\square$ is the sheet resistance in $\Omega/\square$.

In one embodiment, conductive trace elements 330 may each include or consist essentially of a silver ink. As an example, a silver ink having a thickness of about 4 μm may have a sheet resistance of about $0.07 \Omega/\square$, and thus the distributed resistance of the layout in FIG. 3B is about 2.45Ω. In another example, conductive trace elements 330 may each include or consist essentially of aluminum having a resistivity of about $2.8 \times 10^{-6}$ Ω-cm, resulting in a distributed resistance for the layout of FIG. 3B of about 0.1Ω. In some embodiments, the resistivity of conductive elements 330 may be in the range of about $1 \times 10^{-8}$ Ω-cm to about 1 Ω-cm.

Figure 4A:
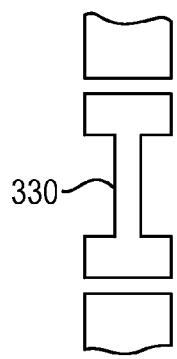
FIGS. 4A-4C and 5A-5D are schematic illustrations of electrical trace elements in accordance with various embodiments of the invention.
Figure 4B:
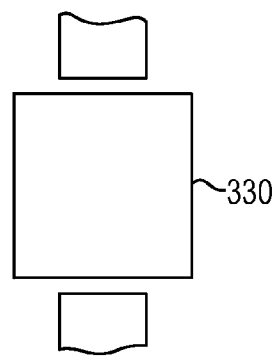
Figure 4C:
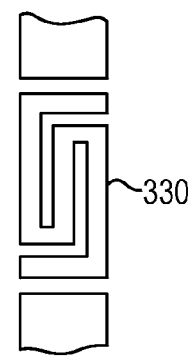

In some embodiments, a range of resistance values may be achieved for a given material of conductive trace elements 330. In some embodiments, a relatively lower resistance may be achieved by making all or some of conductive trace elements 330 wider and/or thicker and/or making the sum of the lengths of all of conductive trace elements 330 shorter. In some embodiments, a relatively higher resistance may be achieved by making all or some of conductive trace elements 330 narrower and/or thinner and/or making the sum of the lengths of all of conductive trace elements 330 longer. FIGS. 4A-4C show three different examples of geometries of conductive trace elements 330; however, these are not meant to be limiting to the invention, and in other embodiments conductive trace elements may have any shape, including any length and any width. FIG. 4A shows an embodiment in which a portion of conductive trace 330 is relatively narrow, resulting in a relatively larger resistance. FIG. 4B shows an embodiment in which a portion of conductive trace 330 is relatively wide, resulting in a relatively smaller resistance. FIG. 4C shows an embodiment in which a portion of conductive trace 330 is relatively long, resulting in a relatively higher resistance.

In some embodiments, resistance values different from what might be achieved for the conductive trace material may be desired but may be difficult to achieve with the available geometries. For example, the width of the conductive trace may be limited by the technique used to form the conductive trace or the geometry of the circuit layout. In another example, the thickness may be limited to a certain range. In some embodiments, additional steps may be carried out to further modify the geometry and thus modify the resistance, or an additional material may be formed on substrate 110 to achieve the desired resistance values, as described herein.

Figure 5A:
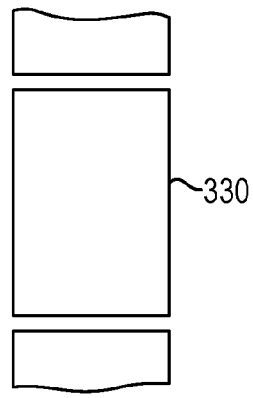
Figure 5B:
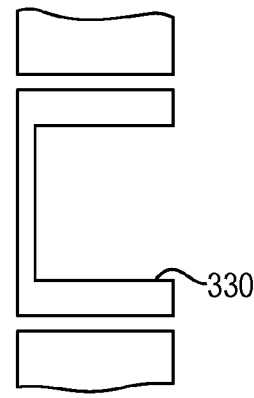
Figure 5C:
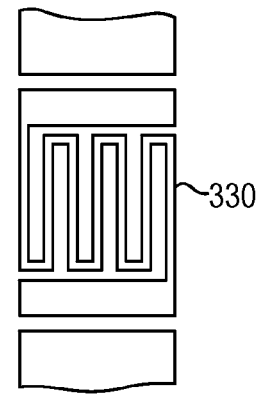
Figure 5D:
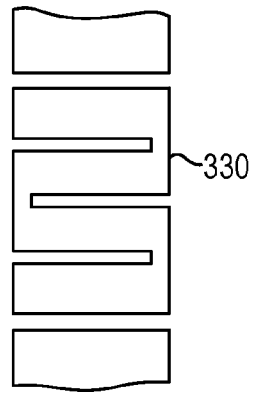

In one embodiment, the existing pattern may be modified to increase the resistance, for example by forming longer and/or narrower lines. FIG. 5A shows a conductive element during manufacture. Each of FIGS. 5B-5D shows the structure of FIG. 5A at a later stage of manufacture. The structures of FIGS. 5B-5D have been modified by removal of material to increase the resistance of conductive trace element 330. In one embodiment, material is removed using laser processing, for example to cut or ablate conductive trace element 330 material from substrate 110. For example, in the structure shown in FIG. 5B, if about 90% of the material is removed from conductive trace element 330, its resistance will increase by about a factor of 10. In FIGS. 5C and 5D, the structure of FIG. 5A is modified to reduce the width and increase the length of the conductive trace element 330.

Another aspect of this approach is that the resistance value of conductive trace element 330 may be modified or tuned after formation of lightsheet 100. For example, lightsheet 100 may be manufactured with conductive trace elements having a particular geometry and a particular resistance. This resistance may be increased by subsequent removal of a portion of the material of one or more conductive trace elements 330. In some embodiments, this may be used to accommodate a range of different components, for example LEEs emitting different colors that include or consist essentially of different materials and thus have different bandgaps, and/or LEEs that have different operating voltages. In some embodiments, this may be done to accommodate variations in forward voltage for one type of LEE. For example, in some embodiments LEDs are tested and binned into forward voltage groups. In order to achieve optimum performance, for example to optimize efficiency, the current through the LEDs may be tuned to accommodate relatively small differences in forward voltage, for example in embodiments where relatively large number of LEDs are electrically coupled in series. Using the approach described herein, in one embodiment the current may be tuned by modifying or adjusting the resistance by subsequent processing without the need to maintain a large stock of resistors having different resistances. One embodiment where this approach may be useful is in a system including or consisting essentially of more than one strings of LEDs (as shown in FIGS. 3A and 3B) that are connected in parallel across a set of common power bus lines.

Figure 5E:
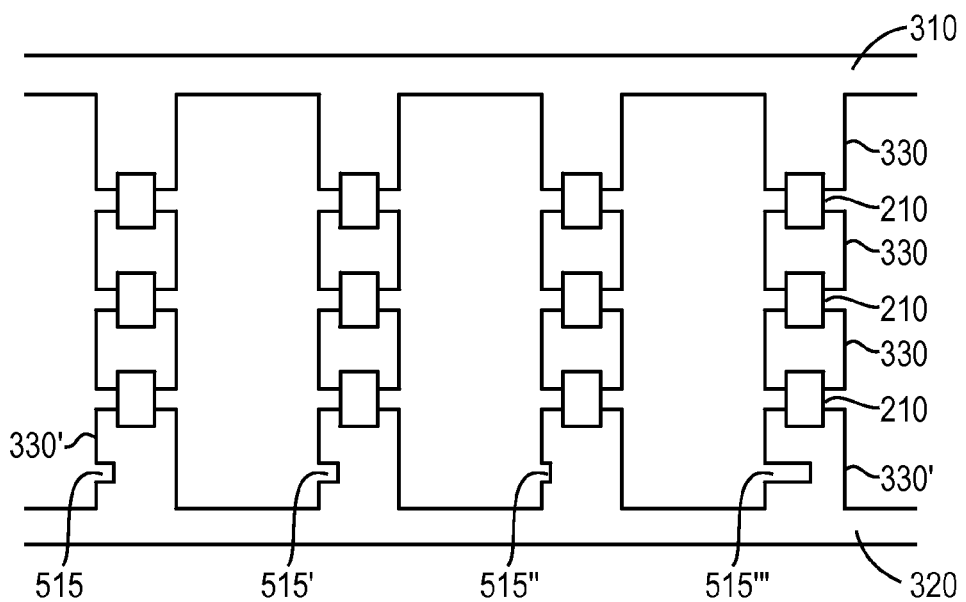
FIG. 5E is a schematic illustration of a portion of a lighting system in accordance with various embodiments of the invention.

FIG. 5E shows a system similar to that of FIG. 3B at a later stage of manufacture, where conductive elements 330' closest to power conductor 320 have been modified or trimmed to adjust the distributed resistance of the string in order to adjust the value of the current in each string. In this example, the trimming includes or consists essentially of removal of portions 515, 515', 515'', 515''' of conductive elements 330'. As may be seen in FIG. 5E, the amount of material removed may be different for each trim portion 515, 515', 515'', 515'''. In this example, the amount of material removed in trim 515'' is the smallest, while the material removed in trim 515''' is the largest.

In various embodiments it may be desirable to have the current in each string equal or substantially equal in order to achieve substantially the same light output from each string. For example, consider the situation where the forward voltage of LEEs 210 may vary from about 2.8 volts to about 3.1 volts at a set current value, for example 100 mA, due to, e.g., manufacturing variations in LEEs 210. If the average forward voltage at 100 mA is about 2.95 volts and the distributed resistor has a nominal value of 10 ohms, then the voltage across power conductors 310 and 320 is 10 ohms×0.1 A+3× 2.95=1+8.85=9.85 volts. If all LEEs 210 have a forward voltage of about 2.95 volts, then each string will have a current of about 100 mA. However, consider the extreme case in which all LEEs 210 in one string have a forward voltage of about 2.8 volts. Then, the string current is (9.85−(3×2.8))/10=1.45/10=145 mA. At the other extreme, in which all LEEs 210 in one string have a forward voltage of about 3.1 volts, the string current is (9.85−(3×3.1))/10=0.55/10=55 mA. As may be seen, these extreme situations would result in significantly different current through those strings, with a resulting undesirable increase or decrease in light output power. The structure shown in FIG. 5E may be used to mitigate such a situation, where each conductive element 330' has been modified or trimmed to adjust the distributed resistance of the string to make the value of the current in each string substantially the same. For example, in the case where LEEs 210 have a forward voltage of about 2.8 volts, the distributed resistance may be adjusted to about 14.5 ohms to achieve a current of about 100 mA.

In some embodiments, it may be desirable to decrease the resistance, for example in a case in which LEEs 210 have a forward voltage of about 3.1 volts, the distributed resistance may be adjusted to about 5.5 ohms to achieve a current of about 100 mA. In some embodiments, additional material may be added to conductive element 330 to decrease the resistance of that element. Techniques for adding material may include, for example, dispensing a conductive material over all or one or more portions of conductive element 330, formation of a conductive adhesive or tape over all or one or more portions of conductive element 330, lamination of a conductive material over all or one or more portions of conductive element 330, or the like.

While the example discussed aims to set a substantially similar current in each string, this is not a limitation of the present invention, and in other embodiments this approach may be used to set different values of current in different strings.

Figure 5F:
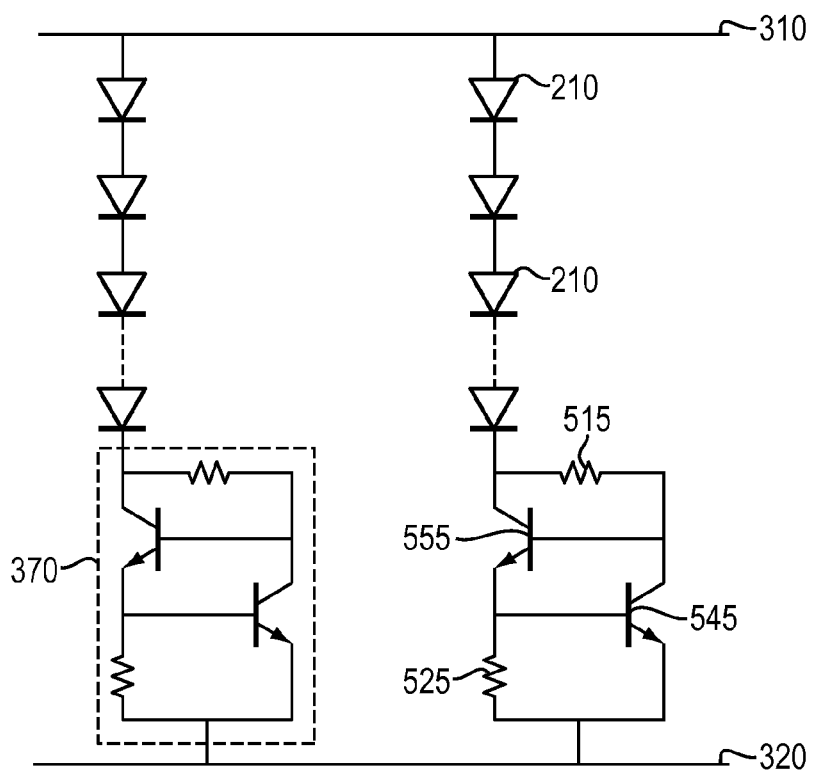
FIG. 5F is a circuit diagram of a portion of a lighting system in accordance with various embodiments of the invention.

FIG. 5F shows an electrical schematic of another embodiment of the invention in which resistor 220 of FIG. 3A has been replaced by a circuit 370 that includes or consists essentially of two transistors 545, 555 and two resistors 515, 525. Resistor 525 nominally sets the current in the string; however, the string current may vary as a result of manufacturing variations in components 515, 525, 545, 555 and/or LEEs 210, resulting in a variation in current in each string. In some embodiments, resistor 525 may be modified or trimmed to adjust the current in each string, for example to adjust each string to have the same or substantially the same current, or to have different current values. In some embodiments, resistor 525 may be a discrete resistor, for example a SMD resistor (e.g., a SMD resistor designed for laser trimming), while in other embodiments resistor 525 may be a distributed resistor as described herein. Modification of the resistance may be accomplished using a variety of means, for example laser ablation, laser melting, laser cutting, etching, patterning and etching, grinding, sand blasting, or the like. The method of modification of the resistance is not a limitation of the present invention. In some embodiments, the current in the string is monitored while the modification of the resistor is performed and is used as a feedback value to determine the desired amount of modification. For example, modification may include modification of one or more conductive elements and/or modification of one or more SMD devices.

In another embodiment, a wider range of resistance values may be accessed by forming conductive trace elements with more than one thickness. In some embodiments, conductive trace element 330 thickness may be increased, either in selected regions or overall, resulting in a lower resistance, while in other embodiments conductive trace element 330 thickness may be reduced, resulting in a higher resistance. In one embodiment, this may be accomplished by applying more than one layer of conductive trace element 330 to substrate 110. In one embodiment, the thickness of conductive trace element 330 may be reduced, either globally or selectively, by removing a portion of the thickness of conductive trace element 330, for example using ablation, laser ablation, sputtering, dry etching, wet chemical etching, reactive ion etching, sand blasting, or the like. The method by which the thickness of all or a portion of conductive trace element 330 is reduced is not a limitation of the present invention.

Figure 6:
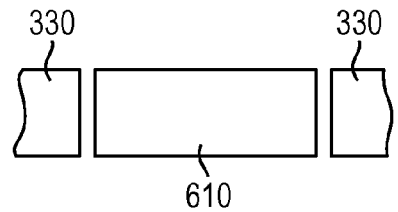
FIG. 6 is a schematic illustration of electrical trace elements in accordance with various embodiments of the invention.

In another embodiment, a wider range of resistance values may be accessed by forming a second material on substrate 110 that is in essence a conductive trace with a different resistivity and sheet resistance. For example, FIG. 6 shows a structure including first conductive trace elements 330 and a second conductive trace element 610. In some embodiments, first conductive trace element 330 and second conductive trace element 610 are made of different materials having different resistivity. For example, in one embodiment first conductive trace element 330 may include or consist essentially of aluminum, while second conductive trace element 610 may include or consist essentially of carbon. In some embodiments, as discussed herein, first conductive trace element 330 and second conductive trace element 610 are made of the same material, but have different thicknesses. For example, in one embodiment first conductive trace element 330 may include or consist essentially of aluminum and have a thickness of about 30 µm, while second conductive trace element 610 may include or consist essentially of aluminum and have a thickness of about 4 µm. In some embodiments, the conductive trace may include or consist essentially of two or more layers, for example including carbon, copper, aluminum, gold, silver, chromium, or the like. In some embodiments, the two or more layers may have the same shape, size and thickness, while in other embodiments the shape, size and/or thickness may be different for the different layers. In some embodiments, the two or more layers may be separate, as shown in FIG. 6, while in other embodiments they may be touching (i.e., one layer may partially or completely overlap the other layer), and in at least portions of the overlapping material, form a relatively low resistance electrical connection.

In another embodiment of the present invention, other circuit elements, for example capacitors and inductors, may be incorporated in a distributed fashion as part of the circuit board. FIGS. 7A and 7B show two examples of a capacitor integrated into a circuit board. FIG. 7A shows two conductive traces 710, 720 each having a protruding portion 711, 721 separated by a relatively smaller distance than the separation between conductive traces 710 and 720 away from portions 711, 721. The structure in FIG. 7A features one layer of conductive trace; thus, the capacitor is a lateral capacitor between two or more adjacent traces on the same side of substrate 110. For a parallel plate capacitor, the capacitance may be calculated as $C = \in A/d$, where $\in$ is the dielectric constant of the material between the parallel plates, A is the area of the plates, and d is the spacing between the plates. In this case the material between the plates is essentially air, and thus the dielectric constant to be used for this structure is that of air (i.e., about 1). In this example the spacing is identified as 730 and the area is the product of the length 740 in FIG. 7A and the thickness of conductive traces 710, 720.

FIG. 7B shows another embodiment that features conductive traces on both sides of a substrate 110. In this example, conductive trace element 330 is on the top of substrate 110, and opposite at least a portion of conductive trace element 330 is a conductive trace element 750. In one embodiment, conductive trace element 750 is connected to ground, and thus this would form a capacitor to ground. In one embodiment, conductive trace element 750 is connected to another part of the circuit, thus forming a capacitor between conductive trace element 330 and that other part of the circuit. In this case substrate 110 is between the plates of the capacitor and thus the dielectric constant is that of substrate 110. In some embodiments, substrate 110 includes or consists essentially of PET having a dielectric constant of about 3.4. The spacing d between the plates is identified in FIG. 7B as 730. The area of the plates is approximately the overlapping area between conductive trace element 330 and conductive trace element 750. In some embodiments, conductive trace element 750 is completely covered by conductive trace element 330 and the area is given by the area of conductive trace element 750. In one embodiment, substrate 110 includes or consists essentially of PET having a dielectric constant of about 3.4 and a thickness of about 38 µm and the overlapping area between conductive trace elements 330, 750 is about 1 cm². In this example, the capacitance is about $2.33 \times 10^{-7}$ farad, or 0.23 µf.

Inductors may be incorporated into lightsheet 100 as well. In one embodiment featuring substrate 110 having conductive trace elements on both sides, an inductor may be formed using a spiral inductor geometry, as shown in FIGS. 8A-8C. FIG. 8A is a plan view of a spiral inductor while FIG. 8B is an electrical schematic showing connection points 810, 830. FIG. 8C is a cross-sectional view of the structure of FIG. 8A. In the illustrated embodiment, connection point 810 is on the top of substrate 110, while connection point 830 is on the bottom of substrate 110. The conductive traces on the top and bottom of substrate 110 are connected at the center of the spiral inductor by a via 840, as shown in FIG. 8C. Connection point 830 may be optionally brought to the same side of substrate 110 as connection point 810 using another via 840, as shown in FIG. 8C. As will be understood by those skilled in the art, the inductance of a spiral inductor may be approximated in various ways or may be simulated. In some embodiments the inductance of a "square" spiral inductor (as shown in FIG. 8A) may be estimated as $(37.5 \, \mu n^2 a^2)/(22r-14a)$, where n is the number of turns, a is the distance from the center to the mean of the winding radii, 2r is the lateral dimension of the "square" spiral and µ is the permeability of the material surrounding the spiral. As understood by those skilled in the art, spiral inductors may have a circular, square, octagonal, or other geometry (i.e., of the spirals). Inductors may also have a serpentine geometry. The specific geometry of the inductor is not a limitation of the present invention.

In another embodiment, a portion of a conductive trace may be used as a fuse. In this embodiment the conductive trace element has a greatly reduced width and/or thickness, such that at a predetermined current level, the $I^2R$ or resistance heating of the fuse element is sufficient to melt or vaporize all or a portion of the fuse element, thus interrupting the flow of current through that element. FIG. 9 shows an example of such a fuse element 910. As may be seen from FIG. 9, in one embodiment fuse element 910 is significantly narrower than adjacent conductive elements 330. In some embodiments, the resistance of fuse element 910 may be relatively insignificant to the operation of the system and it may be ignored, while in other embodiments the resistance of fuse element 910 may need to be taken into account during the design of the overall system. While FIG. 9 shows one fuse element 910, this is not a limitation of the present invention, and in other embodiments more than one fuse element 910 may be employed. While fuse element 910 may be composed of the same material as conductive trace element 330, this is not a limitation of the present invention and in other embodiments fuse element 910 may include or consist essentially of a material different from that of conductive trace element 330. As will be understood by those skilled in the art, the specific dimensions of fuse element 910 may be dependent not only on the desired fuse current level and material of fuse element 910 but on the material and thermal properties of substrate 110 and the ambient conditions surrounding substrate 110.

In some embodiments of the present invention, the electrical function of component 130 (FIG. 1A) may be divided between one or more discrete components and one or more distributed components.

Figure 10:
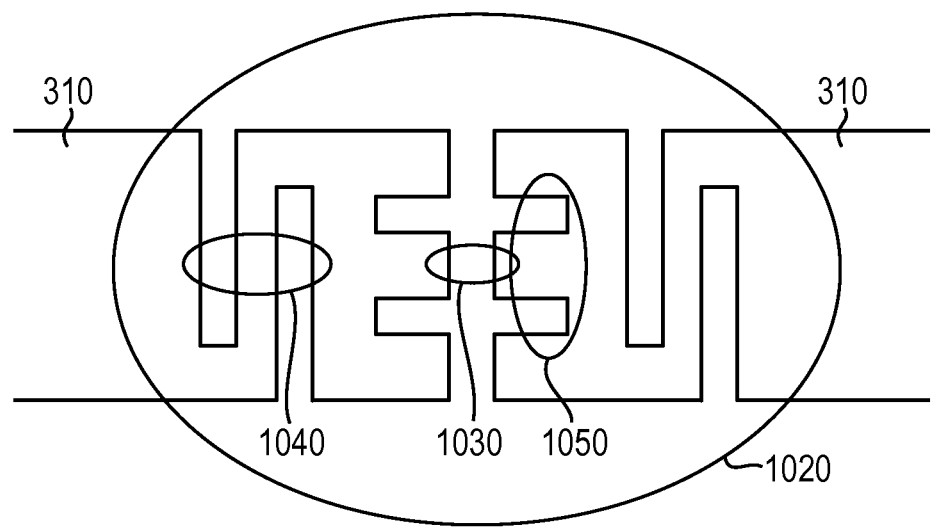
FIG. 10 is a schematic illustration of portions of electrical trace elements in accordance with various embodiments of the invention.

In various embodiments of the present invention, a stress-relief feature is provided to the conductive traces to reduce the stress that may be imposed on components mounted on lightsheet 100. FIG. 10 depicts an exemplary structure in accordance with embodiments of the present invention, although alternative systems with similar functionality are also within the scope of the present invention. FIG. 10 is a plan view of one embodiment of the present invention that features a stress-relief feature 1020 in a bonding region 1030 where a component is to be bonded to the substrate and/or conductive traces. As may be seen from FIG. 10, stress-relief feature 1010 incorporates one or more breaks or gaps in the conductive trace pattern, which may be undulating, multi-pronged, and/or sinuous. In the embodiment shown in FIG. 10, a first stress-relief feature 1040 separates bonding region 1030 from the remainder of conductive trace 330, while a second stress-relief feature 1050 is adjacent to bonding region 1030. It should be noted that the particular number and arrangement of stress-relief features shown in FIG. 10 is not a limitation of the present invention, and in other embodiments only one stress-relief feature may be present or more than two stress-relief features may be present. In one embodiment, the stress-relief feature or features are designed to reduce the area of the conductive trace that is directly connected to or adjacent to bonding region 1030. In one embodiment, the stress-relief feature or features are designed to reduce the area of the conductive trace that is within line of sight of bonding region 1030. In one embodiment, the stress-relief feature includes or consists of one or more portions of conductive trace 310 having a width less than that of the main portion of the conductive trace. For example, in one embodiment the stress-relief feature may have at least a portion having a width that is less than 50% of the width of the main portion of the conductive trace (i.e., the portion away from bonding region 1030). In one embodiment, the stress-relief feature may have at least a portion having a width that is less than 25% of the width of the main portion of the conductive trace. In one embodiment, the stress-relief feature may have at least a portion having a width that is less than 10% of the width of the main portion of the conductive trace. In one embodiment, the stress-relief feature may have at least a portion having a width that is less than 5% of the width of the main portion of the conductive trace. In one embodiment the main portion of the conductive trace has a width of about 7 mm and the stress-relief feature has a width of about 0.5 mm. In one embodiment, the main portion of the conductive trace has a width of about 7 mm and the stress-relief feature has a width of about 0.25 mm. In one embodiment, the main portion of the conductive trace has a width of about 25 mm and the stress-relief feature has a width of about 0.25 mm. In one embodiment, the main portion of the conductive trace has a width of about 2 mm and the stress-relief feature has a width of about 0.25 mm. In some embodiments, the stress-relief feature includes or consists essentially of a serpentine layout having at least a portion having a width that is less than 50%, 25%, 10%, or even 5% of the width of the main portion of the conductive trace. In some embodiments, conductive traces 310 have a width in the range of about 0.1 mm to about 50 mm. In some embodiments, conductive traces 310 have a width in the range of about 0.5 mm to about 15 mm. In some embodiments, conductive traces have a thickness in the range of about 2 μm to about 100 μm. In some embodiments, conductive traces have a thickness in the range of about 5 μm to about 50 μm.

In one embodiment, base material 110 may have a relatively low modulus of elasticity and be easily elastically deformed. Modulus of elasticity may also be referred to as Young's modulus or elastic modulus. In some embodiments, base 110 may be relatively thin, to aid in elastic deformation. In some embodiments, base 110 may include or comprise PET. In some embodiments, base 110 may have a thickness in the range of about 10 μm to about 250 μm. In some embodiments, conductive trace 310 may have a modulus of elasticity relatively greater than that of base 110. In some embodiments, the ratio of the Young's modulus of conductive trace 310 to the Young's modulus of base 110 is greater than 3, or greater than 10, or greater than 50, or greater than 100, or greater than 250. For example, in one embodiment base 110 includes or consists essentially of PET with a Young's modulus of about $2\times10^9$ N/m$^2$ and conductive trace 310 includes or consists essentially of aluminum with a Young's modulus of about $69\times10^9$ N/m$^2$, and the ratio of the modulus of conductive trace 310 to base 110 is about 34.5. In another embodiment, base 110 includes or consists essentially of PET with a Young's modulus of about $2\times10^9$ N/m$^2$ and conductive trace 310 includes or consists essentially of copper with a Young's modulus of about $117\times10^9$ N/m$^2$, and the ratio of the modulus of conductive trace 310 to base 110 is about 58.5. In another embodiment, base 110 includes or consists essentially of PET with a Young's modulus of about $2\times10^9$ N/m$^2$ and conductive trace 310 includes or consists essentially of graphene with a Young's modulus of about $1000\times10^9$ N/m$^2$, and the ratio of the modulus of conductive trace 310 to base 110 is about 500. In another embodiment, base 110 includes or consists essentially of glass-reinforced polyester with a Young's modulus of about $17\times10^9$ N/m$^2$ and conductive trace 310 includes or consists essentially of aluminum with a Young's modulus of about $69\times10^9$ N/m$^2$, and the ratio of the modulus of conductive trace 310 to base 110 is about 4.

Figure 11A:
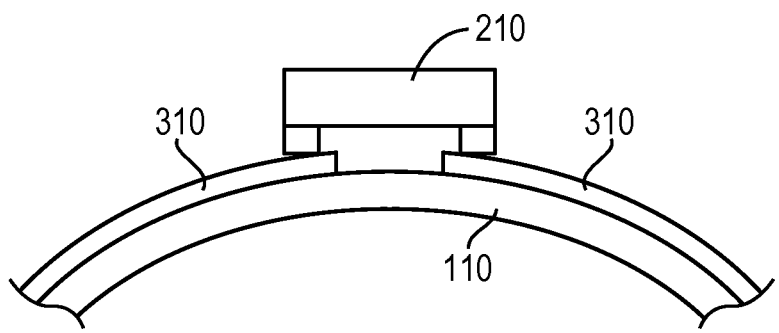
FIGS. 11A and 11B are schematic illustrations of portions of lighting systems without stress-relief features and with stress-relief features, respectively, in accordance with various embodiments of the invention.
Figure 11B:
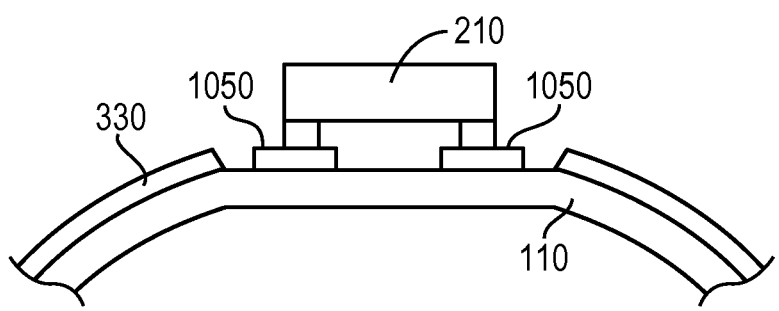

FIGS. 11A and 11B show examples of lightsheet 100 with and without stress-relief features. While the structure in FIG. 11B incorporates stress-relief features 1050, this is not a limitation of the present invention and other embodiments may include stress-relief features 1040 or both stress-relief features 1040 and 1050 or one or more other types of stress-relief features. As may be seen by comparing FIGS. 11A and 11B, substantially the same amount of bend in substrate 110 produces a relatively lower radius of curvature in the region under component 210 and a relatively lower amount of stress on component 210 for the structure of FIG. 11B compared to the structure of FIG. 11A because the extent of conductive trace directly attached to and applying pressure to component 210 is relatively smaller in the case of the structure of FIG. 11B.

In reference to FIG. 11B, in one embodiment the radius of curvature of substrate 110 may be about two times as large as the radius of curvature of the region of LEE 210. In reference to FIG. 11B, in one embodiment the radius of curvature of substrate 110 may be about five times as large as the radius of curvature of the region of LEE 210. In reference to FIG. 11B, in one embodiment the radius of curvature of substrate 110 may be about 50 mm and the radius of curvature of the region of LEE 210 may be about 100 mm. In reference to FIG. 11B, in one embodiment the radius of curvature of substrate 110 may be about 100 mm and the radius of curvature of the region of LEE 210 may be about 1000 mm. In some embodiments, component 210 includes or consists essentially of an LEE, for example an LED. In some embodiments, LEE 210 includes or consists essentially of a packaged LED. In some embodiments, LEE 210 includes or consists essentially of a bare-die LED. In some embodiments, component 210 includes or consists essentially of a resistor, inductor, capacitor, fuse, transistor, diode, and/or integrated circuit. In some embodiments, LEE 210 includes or consists essentially of a bare-die LED and a wavelength-conversion material. In some embodiments, the wavelength-conversion material includes or consists essentially of one or more phosphor materials.

As used herein, "phosphor" refers to any material that shifts the wavelengths of light irradiating it and/or that is fluorescent and/or phosphorescent, and is utilized interchangeably with the term "light-conversion material" or "phosphor conversion element." As used herein, a "phosphor" may refer to only the powder or particles (of one or more different types) or to the powder or particles with the binder. The light-conversion material is incorporated to shift one or more wavelengths of at least a portion of the light emitted by LEEs to other desired wavelengths (which are then emitted from the larger device alone or color-mixed with another portion of the original light emitted by the die). A light-conversion material may include or consist essentially of phosphor powders, quantum dots, organic dye or the like within a transparent matrix. Phosphors are typically available in the form of powders or particles, and in such case may be mixed in binders. An exemplary binder is silicone, i.e., polyorganosiloxane, which is most commonly polydimethylsiloxane (PDMS). Phosphors vary in composition, and may include lutetium aluminum garnet (LuAG or GAL), yttrium aluminum garnet (YAG), or other phosphors known in the art. GAL, LuAG, YAG and other materials may be doped with various materials including for example Ce, Eu, etc. The specific components and/or formulation of the phosphor and/or matrix material are not limitations of the present invention. As used herein, a "phosphor chip" is a discrete piece or layer of phosphor that has been fabricated and cured while unattached to any LEE, and that may be later coupled to an LEE by, e.g., optical bonding or via an optical adhesive.

The binder may also be referred to as an encapsulant or a matrix material. In one embodiment, the binder includes or consists essentially of a transparent material, for example silicone-based materials or epoxy, having an index of refraction greater than 1.35. In one embodiment the phosphor includes or consists essentially of other materials, for example fumed silica or alumina, to achieve other properties, for example to scatter light, or to reduce settling of the powder in the binder. An example of the binder material includes materials from the ASP series of silicone phenyls manufactured by Shin Etsu, or the SYLGARD series manufactured by Dow Corning.

In some embodiments LEE 210 may include or consist essentially of one or more semiconductor materials, e.g., silicon, InAs, AlAs, GaAs, InP, AlP, GaP, InSb, GaSb, AlSb, GaN, AN, InN, and/or mixtures and alloys (e.g., ternary or quaternary, etc. alloys) thereof. In some embodiments, LEE 210 may emit essentially blue light. In some embodiments LEE 210 may emit substantially white light.

While FIG. 10 shows essentially one stress-relief feature on either side of bonding region 1030, this is not a limitation of the present invention and in other embodiments a stress-relief feature may be included only on one side of bonding region 1030, or more than one stress-relief feature may be included on either or both sides of bonding region 1030. As will be understood in reference to FIG. 3B, a string includes or consists essentially of multiple conductive elements separated by gaps in bonding region 1030. Stress-relief features may be formed adjacent to all bonding regions 1030 or only some of bonding regions 1030. For example, bonding regions 1030 may be formed in areas that are determined to experience higher stress levels during manufacture or operation.

Substrate 110 may include or consist essentially of a semicrystalline or amorphous material, e.g., polyethylene naphthalate (PEN), polyethylene terephthalate (PET), polycarbonate, polyethersulfone, polyester, polyimide, polyethylene, fiberglass, FR4, metal core printed circuit board, and/or paper. Substrate 110 may include multiple layers, e.g., a deformable layer over a rigid layer, for example, a semicrystalline or amorphous material, e.g., PEN, PET, polycarbonate, polyethersulfone, polyester, polyimide, polyethylene, and/or paper formed over a rigid substrate for example comprising, acrylic, aluminum, steel and the like. Depending upon the desired application for which embodiments of the invention are utilized, substrate 110 may be substantially optically transparent, translucent, or opaque. For example, substrate 110 may exhibit a transmittance or a reflectivity greater than 70% for optical wavelengths ranging between approximately 400 nm and approximately 700 nm. In some embodiments substrate 100 may exhibit a transmittance or a reflectivity of greater than 70% for one or more wavelengths emitted by LEE 210. Substrate 110 may also be substantially insulating, and may have an electrical resistivity greater than approximately 100 ohm-cm, greater than approximately $1\times10^6$ ohm-cm, or even greater than approximately $1\times10^{10}$ ohm-cm.

Conductive elements 120 and 310 may be formed via conventional deposition, photolithography, and etching processes, plating processes, lamination, lamination and patterning, evaporation sputtering or the like or may be formed using a variety of different printing processes. For example, conductive elements 120 and 310 may be formed via screen printing, flexographic printing, ink jet printing, and/or gravure printing. Conductive elements 120 and 310 may include or consist essentially of a conductive material (e.g., an ink or a metal, metal film or other conductive materials or the like), which may include one or more elements such as silver, gold, aluminum, chromium, copper, and/or carbon. Conductive elements 120 and 310 may have a thickness in the range of about 50 nm to about 1000 µm. In some embodiments the thickness of conductive elements 120 and 310 may be determined by the current to be carried thereby. While the thickness of one or more of conductive elements 120 and 310 may vary, the thickness is generally substantially uniform along the length of the trace to simplify processing. However, this is not a limitation of the present invention and in other embodiments the thickness and/or material of conductive elements 120 and 310 may vary. In some embodiments, all or a portion of conductive elements 120 and 310 may be covered or encapsulated. In some embodiments, a layer of material, for example insulating material, may be formed over all or a portion of conductive elements 120 and 310. Such a material may include, e.g., a sheet of material such as used for substrate 110, a printed layer, for example using screen, ink jet, stencil or other printing means, a laminated layer, or the like. Such a printed layer may include, for example, an ink, a plastic and oxide, or the like. The covering material and/or the method by which it is applied are not limitations of the present invention.

Figure 12:
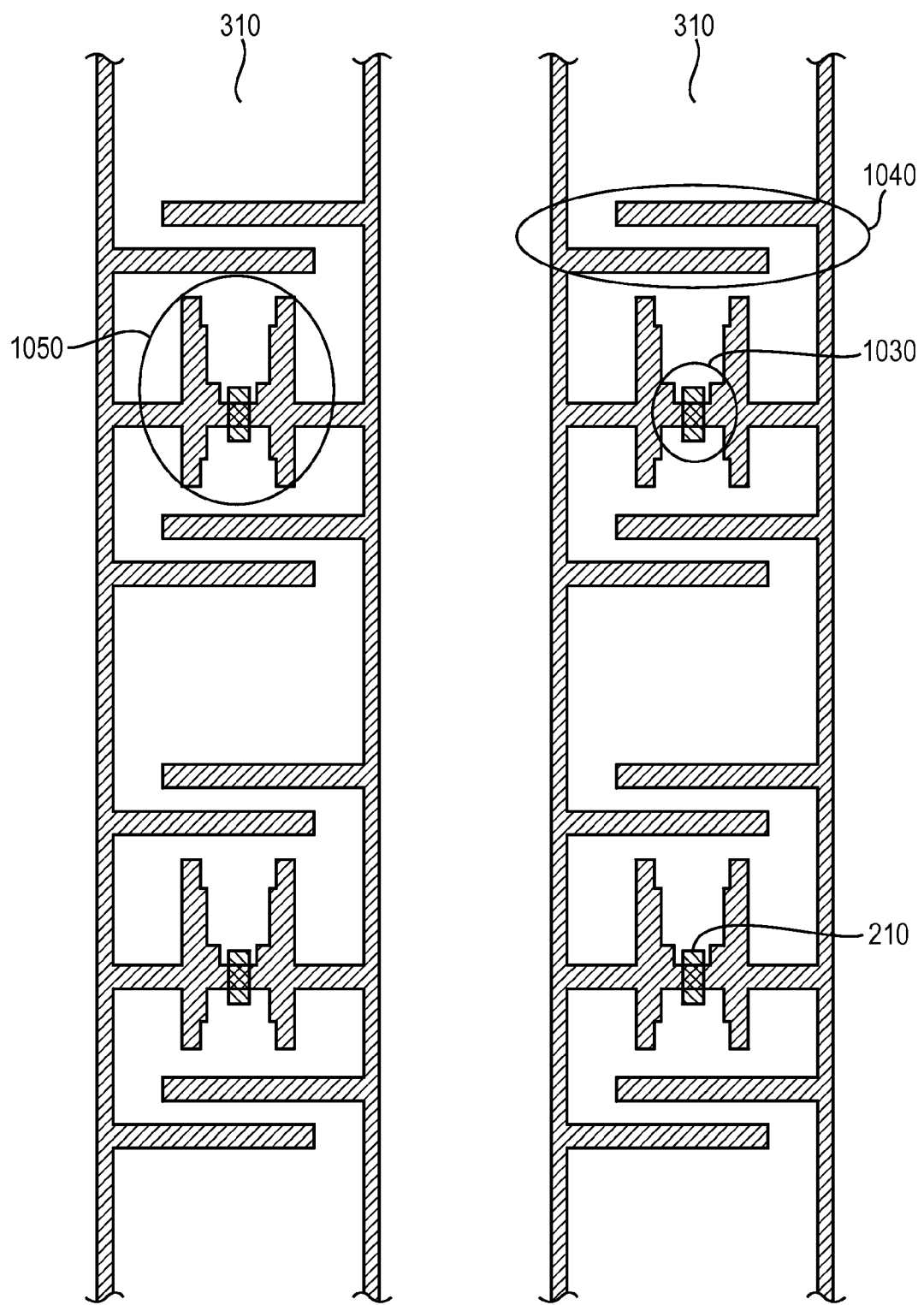
FIG. 12 is a schematic illustration of electrical trace elements incorporating stress-relief features in accordance with various embodiments of the invention.

FIG. 12 shows a schematic of one example of a lightsheet 1200 or a portion of a lightsheet that may be used on various LED lighting systems in accordance with various embodiments of the present invention. Additional details of lightsheets used in accordance with embodiments of the invention may be found in U.S. patent application Ser. No. 13/799,807, filed on Mar. 13, 2013, the entire disclosure of which is incorporated herein by reference.

Lightsheet 1200 may feature a substrate 110 (not identified in FIG. 12 for clarity), as well as conductive traces 310 with stress-relief features 1040 and 1050. Lightsheet 1200 shown in FIG. 12 has two strings of series-connected LEEs; however, this is not a limitation of the present invention, and in other embodiments lightsheet 1200 may include more than two strings of series-connected LEEs. Lightsheet 1200 shown in FIG. 12 has two LEEs 210 per string; however, this is not a limitation of the present invention, and in other embodiments lightsheet 1200 may include more than two LEEs 210 per string. In some embodiments, lightsheet 1200 may include other components in addition to LEE 210, for example transistors, resistors, capacitors, inductors, diodes, fuses, and the like. The number and type of additional components is not a limitation of the present invention.

Figure 13A:
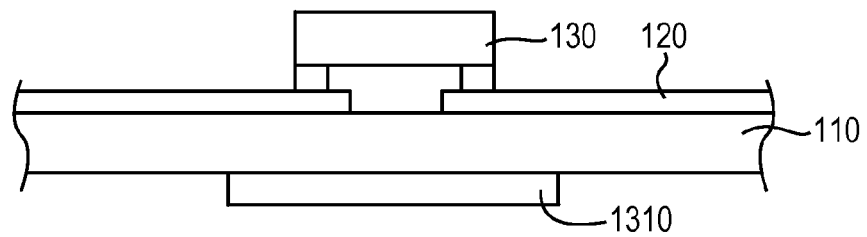
FIG. 13A is a schematic illustration of a lighting system incorporating a stiffening element in accordance with various embodiments of the invention.

In another embodiment of the present invention, a stiffener is incorporated within the structure surrounding component 130 (FIG. 1A) or in bonding region 1030 (FIG. 10) to reduce the stress on component 130 by stiffening substrate 110 in proximity to component 130, for example underneath and/or adjacent to component 130. FIG. 13A depicts an exemplary structure in accordance with embodiments of the present invention, although alternative systems with similar functionality are also within the scope of the present invention. FIG. 13A shows component 130 attached to conductive traces 120 and/or substrate 110 and stiffener 1310 underneath and on the opposite side of substrate 110. Stiffener 1310 may be formed under all or a portion of component 130. For example, in some embodiments stiffener 1310 may be the same size or substantially the same size as component 130. However, this is not a limitation of the present invention and in other embodiments stiffener 1310 may be larger or smaller than component 130.

Figure 13B:
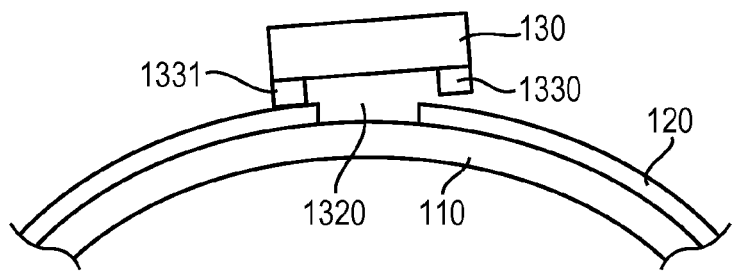
FIG. 13B is a schematic illustration mode of a failure mode of a lighting system under bending stress.

As may be seen in FIG. 13B, in some embodiments conductive traces 130 may act to stiffen substrate 110 in the regions adjacent to component 130, resulting in a possibility of substrate 110 bending in a gap region 1320 between the traces 130. FIG. 13B shows one possible failure mechanism, where contact 1330 of component 130 has separated from conductive trace 120. Other failure mechanisms may occur, for example separation of a portion of conductive trace 120 from substrate 110 or damage to component 130. The failure mechanism is not a limitation of the present invention.

In some embodiments, stiffener 1310 acts to reduce bending of substrate 110 in gap region 1320. In some embodiments, stiffener 1310 may include or consist essentially of the same material as conductive trace 120, while in other embodiments in may include or consist essentially of a different material. In some embodiments stiffener 1310 may include or consist essentially of more than one layer of material. In one embodiment stiffener 1310 may include or consist essentially of at least one of aluminum, gold, silver, carbon, copper, or PET. In some embodiments, stiffener 1310 may include or consist essentially of an ink or tape. In some embodiments stiffener 1310 may be transparent. In some embodiments stiffener 1310 may have a reflectivity or transmissivity of at least 70% to a wavelength of light emitted by LEE 130. For example, in one embodiment substrate 100 includes or consists essentially of PET with a flexural modulus of about 400,000 psi. In one embodiment, stiffener 1310 may include or consist essentially of PET, or PEEK, having a flexural modulus of about 590,000 psi or Vespel Polyimide SP-22 having a flexural modulus of about 700,000. In one embodiment, substrate 110 has a flexural modulus about the same as that of stiffener 1310. In one embodiment, stiffener 1310 has a flexural modulus at least 1.5× that of substrate 110. In one embodiment, stiffener 1310 has a flexural modulus at least 3× that of substrate 110. In one embodiment, substrate 110 has a flexural modulus greater than that of stiffener 1310.

In one embodiment, the stiffener increases the flexural modulus in the area within bonding region 1030 by a factor of about 1.5×. In one embodiment, the stiffener increases the flexural modulus in the area within bonding region 1030 by a factor of about 2×.

While FIG. 13A shows stiffener 1310 on a surface of substrate 110 opposite that of conductive traces 120, this is not a limitation of the present invention, and in other embodiments stiffener 1310 may be on the same surface of substrate 110 as conductive traces 120. For example, stiffener 1310 may be disposed adjacent to a portion of component 130 on the same side of substrate 110 as component 130.

In some embodiments, stiffener 1310 may be formed using the same processes used to form conductive traces 120. In some embodiments, stiffener 1310 may be adhesively attached to substrate 110, for example using a glue, adhesive, transfer tape, or the like. The method of formation of stiffener 1310 on substrate 110 is not a limitation of the present invention. In some embodiments, stiffener 1310 may include or consist essentially of an ink that is selectively applied to either or both the front or back of substrate 110. Such ink may be applied by a variety of means, for example ink jet printing, stencil printing, screen printing, spraying, brushing, dispensing, or the like. The method of application of the ink is not a limitation of the present invention. In one embodiment, stiffener 1310 includes or consists essentially of ink that is white and has a thickness in the range of about 1 μm to about 100 μm. The ink color is not a limitation of the present invention. In one embodiment, stiffener 1310 includes or consists essentially of plastic, for example the material of substrate 110. In one embodiment, stiffener 1310 has a thickness in the range of about 20 μm to about 500 μm. In one embodiment, stiffener 1310 includes or consists essentially of PET. In one embodiment stiffener 1310 includes or consists essentially of PET and has a thickness in the range of about 10 μm to about 200 μm. In one embodiment, stiffener 1310 includes or consists essentially of a metal layer and has a thickness in the range of about 10 μm to about 200 μm. In one embodiment, stiffener 1310 includes or consists essentially of aluminum. In one embodiment, stiffener 1310 includes or consists essentially of copper. In one embodiment, stiffener 1310 includes or consists essentially of a tape, for example an adhesive tape applied to substrate 110.

Figure 13C:
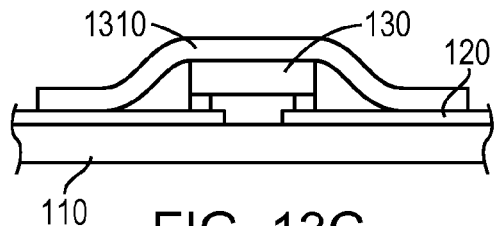
FIGS. 13C-13E are schematic illustrations of lighting systems incorporating stiffening elements in accordance with various embodiments of the invention.
Figure 13D:
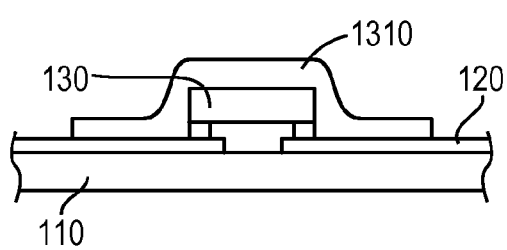
Figure 13E:
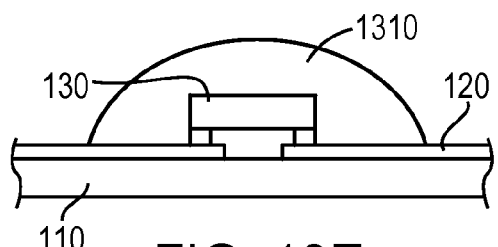

In one embodiment, stiffener 1310 may be disposed over all or a portion of component 130, as shown in FIG. 13C. In such embodiments if component 130 includes or consists essentially of an LEE, stiffener 1310 may be transparent to a wavelength of light emitted by the LEE. FIG. 13C shows an example of stiffener 1310 overlaying all of component 130 and a portion of substrate 110 and a portion of conductive traces 130; however, this is not a limitation of the present invention, and in other embodiments stiffener 1310 may overlay only a portion of component 130 and a portion of substrate 110 and/or a portion of conductive traces 130. In some aspects of this embodiment, stiffener 1310 may include or consist essentially of a tape or adhesive tape, or may include or consist essentially of a layer of material adhesively attached to all or portions of component 130 and portions of substrate 110 and a portion of conductive traces 130. In some embodiments, stiffener 1310 may only be attached to portions of substrate 110 and a portion of conductive traces 130. In one embodiment, stiffener 1310 may include or consist essentially of transparent plastic. In one embodiment, stiffener 1310 may include or consist essentially of transparent PET. In one embodiment, stiffener 1310 may be adhesively attached using a transparent material, for example a transparent adhesive, tape, epoxy, polyurethane silicone, or the like. In one embodiment, the transparent material may have an index of refraction greater than 1.35. An example of the transparent material includes materials from the ASP series of silicones manufactured by Shin Etsu, or the SYLGARD series manufactured by Dow Corning. In some embodiments, stiffener 1310 initially (i.e., when applied) includes or consists essentially of a liquid or gel and may be applied over all or a portion of component 130 using a variety of means, for example dispensing, jetting, printing, ink jet printing, stencil printing, screen printing, or the like. In some embodiments, liquid or gel stiffener 1310 may be cured after application, for example by the application of or exposure to moisture, heat or radiation, for example UV radiation. The means of formation and/or curing of a liquid or gel stiffener 1310 is not a limitation of the present invention. In some embodiments, stiffener 1310 may be disposed in a conformal fashion (i.e., conforming to the contours of underlying features and/or components), as shown in the example in FIG. 13D, while in other embodiments stiffener 110 may be disposed in a non-conformal fashion, for example as shown in FIG. 13E. In some embodiments, stiffener 1310 may have a thickness in the range of about 1 μm to about 500 μm. In some embodiments, stiffener 1310 may have a uniform or substantially uniform thickness, as shown for example in FIG. 13D, while in other embodiments stiffener 1310 may not have a uniform thickness, as shown for example in FIG. 13E. For example stiffener 1310 may include or consist essentially of silicone, urethane, polyurethane, PET, epoxy, or the like. In some embodiments, stiffener 1310 may include or consist essentially of a potting compound, for example Stycast 2651-40 FR manufactured by Hysol or Conepoxy FR-1403 manufactured by Cytec.

Figure 13F:
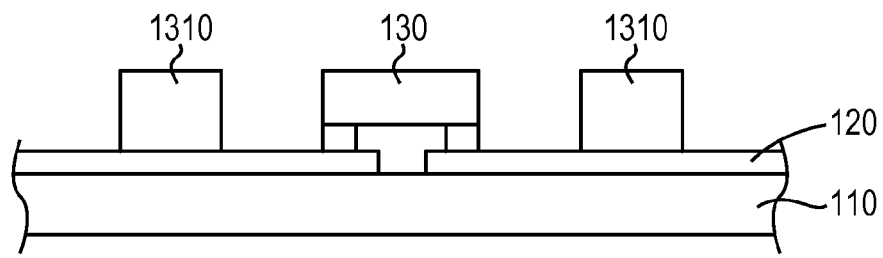
FIGS. 13F and 13G are a schematic cross-section and a schematic plan view, respectively, of a lighting system incorporating a stiffening element in accordance with various embodiments of the invention.
Figure 13G:
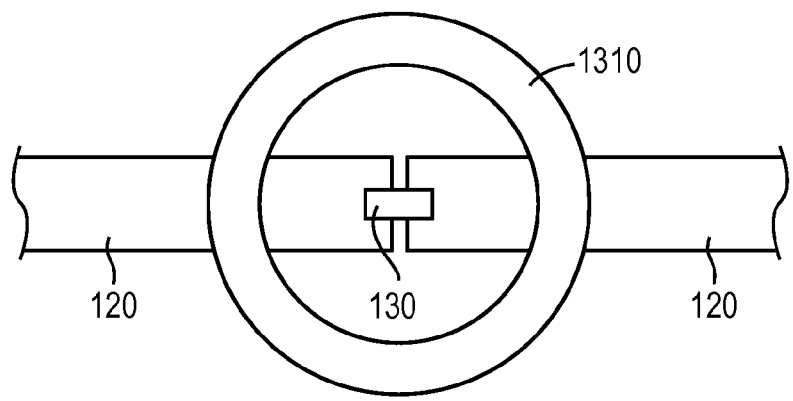
Figure 13H:
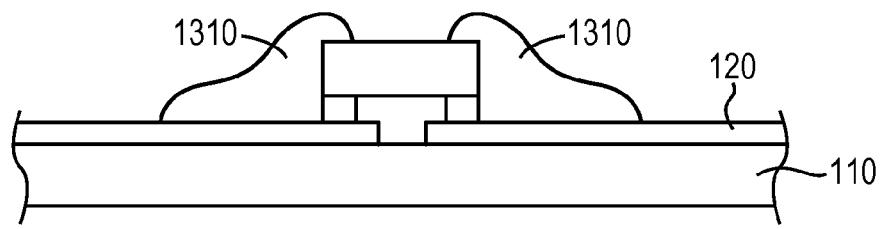
FIG. 13H is a schematic cross-section of a lighting system incorporating a stiffening element in accordance with various embodiments of the invention.
Figure 13I:
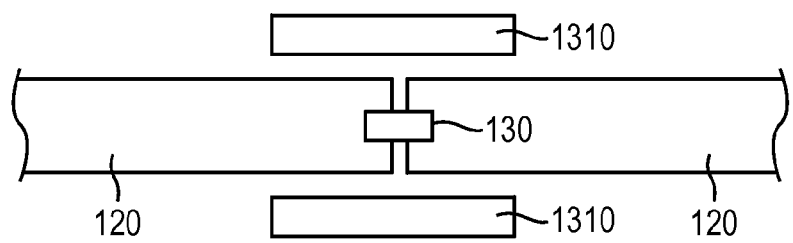
FIG. 13I is a schematic plan view of a lighting system incorporating a stiffening element in accordance with various embodiments of the invention.

In some embodiments, stiffener 1310 may include or consist essentially of a material surrounding all or portions of component 130 or bonding area 1020 but not covering component 130, for example as shown in cross-section and plan view in FIGS. 13F and 13G respectively. While FIG. 13F shows stiffener 1310 having a square cross-section, this is not a limitation of the present invention, and in other embodiments stiffener 1310 may have a rectangular cross-section, a curved cross-section, or any cross-sectional shape. While FIG. 13F shows stiffener 1310 having a substantially constant cross-sectional area, this is not a limitation of the present invention, and in other embodiments the cross-sectional area of stiffener 1310 may vary. While FIG. 13G shows stiffener 1310 having a circular shape, this is not a limitation of the present invention, and in other embodiments stiffener 1310 may have a square shape, rectangular shape, or any shape. In some embodiments stiffener 1310 may include or consist essentially of a material covering a portion of component 130 and surrounding all or portions of component 130 or bonding area 1020, for example as shown in FIG. 13H. While FIG. 13G shows stiffener 1310 completely encircling or surrounding component 130, this is not a limitation of the present invention, and in other embodiments stiffener 1310 may surround or encircle only a portion of component 130, as shown in FIG. 13I.

In one embodiment, base material 110 may have a relatively low modulus of elasticity and be easily elastically deformed. In some embodiments, base 110 may be relatively thin, to aid in elastic deformation. In some embodiments, base 110 may include or consist essentially of PET. In some embodiments, base 110 may have a thickness in the range of about 10 µm to about 250 µm. In some embodiments, stiffener 1310 may have a modulus of elasticity relatively greater than that of base 110. In some embodiments, the ratio of the Young's modulus of stiffener 1310 to the Young's modulus of base 110 is greater than 2, or greater than 10, or greater than 50, or greater than 100, or greater than 250. For example, in one embodiment base 110 includes or consists essentially of PET with a Young's modulus of about $2 \times 10^9$ N/m² and conductive trace 310 (acting in part as a stiffener) includes or consists essentially of aluminum with a Young's modulus of about $69 \times 10^9$ N/m², and the ratio of the modulus of conductive trace 310 to base 110 is about 34.5. In another embodiment, base 110 includes or consists essentially of PET with a Young's modulus of about $2 \times 10^9$ N/m² and conductive trace 310 (acting in part as a stiffener) includes or consists essentially of copper with a Young's modulus of about $117 \times 10^9$ N/m², and the ratio of the modulus of conductive trace 310 to base 110 is about 58.5. In another embodiment, base 110 includes or consists essentially of PET with a Young's modulus of about $2 \times 10^9$ N/m² and conductive trace 310 (acting in part as a stiffener) includes or consists essentially of graphene with a Young's modulus of about $1000 \times 10^9$ N/m², and the ratio of the modulus of conductive trace 310 to base 110 is about 500. In another embodiment, base 110 includes or consists essentially of PET with a Young's modulus of about $2 \times 10^9$ N/m² and stiffener 1310 includes or consists essentially of a potting compound, for example Conapoxy FR 1403 with a Young's modulus of about $4.5 \times 10^9$ N/m², and the ratio of the modulus of stiffener 1310 to base 110 is about 2.25. In another embodiment, base 110 includes or consists essentially of PET with a Young's modulus of about $2 \times 10^9$ N/m² and stiffener 1310 includes or consists essentially of a potting compound, for example Stycast 2651-40 FR with a Young's modulus of about $10 \times 10^9$ N/m², and the ratio of the modulus of stiffener 1310 to base 110 is about 5. In some embodiments, stiffener 1310 may be rigid, while in other embodiments stiffener 1310 may be flexible.

Figure 14A:
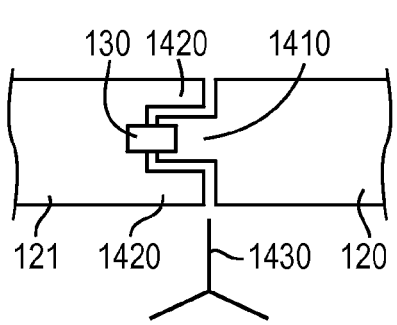
FIGS. 14A and 14B are schematic illustrations of lighting systems incorporating stiffening traces in accordance with various embodiments of the invention.

In one embodiment, stiffener 1310 includes or consists essentially of the same material as conductive traces 120 and the stiffening action is achieved by the design or layout of the conductive trace 120 pattern. FIG. 14A shows one example of an embodiment of the present invention in which conductive traces 120, 121 forming a gap therebetween are not symmetric. In one embodiment, conductive trace 120 has a protruding tab 1410 that is positioned between tabs 1420 on conductive trace 121. Instead of a straight-line gap that may be an initiation point for bending and possible stress concentration and device failure, this structure, and others like it, form a serpentine gap reducing the likelihood of bending or folding in the gap region. (As used herein, the terms "serpentine" and "sinuous" connote any path that is not a single straight line; rather, such a gap is curved, undulating, and/or composed of one or more segments that may be straight and/or rectilinear, but at least two of which are not parallel and may be, e.g., perpendicular. Thus, even a linear path having one or more angles along the length thereof is "serpentine" or "sinuous" within the meaning of the present specification.) In other words, tabs 1410 and 1420 act as stiffeners for substrate 110 and reduce or prevent bending or folding in the gap region. The structure shown in FIG. 14A is designed to prevent folding in a direction perpendicular to the gap; that is, folding across line 1430. In FIG. 14A, conductive traces 120, 121 are relatively wide compared to the width of LEE 130, and they also act to reduce or prevent folding or bending in the perpendicular direction.

Figure 14B:
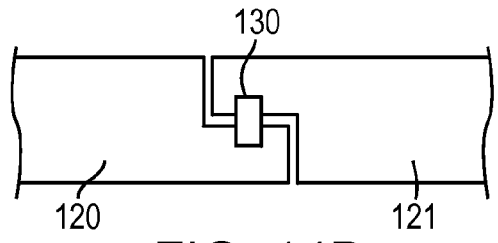

In some embodiments, it may be known in which direction folding may more easily occur, and the layout of conductive traces 120, 121 may be modified to reduce or eliminate bending or folding in that direction. In addition, as shown in FIG. 14B, the orientation of component 130 may be modified as well as the layout of conductive traces 120, 121. In one embodiment, conductive traces 120, 121 may have interpenetrating elements forming a serpentine, instead of entirely linear, gap.

In general in the above discussion the arrays of semiconductor dies, light emitting elements, optics, and the like have been shown as square or rectangular arrays; however this is not a limitation of the present invention and in other embodiments these elements may be formed in other types of arrays, for example hexagonal, triangular or any arbitrary array. In some embodiments these elements may be grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An electronic device comprising:
   a flexible substrate;
   a first conductive trace disposed on and affixed to a first surface of the substrate, the first conductive trace comprising (i) a first end of the first conductive trace, (ii) a second end of the first conductive trace opposite the first end of the first conductive trace, and (iii) disposed between the first end of the first conductive trace and the second end of the first conductive trace, a first serpentine section of the first conductive trace extending along a serpentine path;
   extending substantially collinearly with the first conductive trace, a second conductive trace disposed on and affixed to the first surface of the substrate, the second conductive trace comprising (i) a first end of the second conductive trace, (ii) a second end of the second conductive trace opposite the first end of the second conductive trace, and (iii) disposed between the first end of the second conductive trace and the second end of the second conductive trace, a first serpentine section of the second conductive trace extending along a serpentine path;
   extending substantially collinearly with the first and second conductive traces, a third conductive trace disposed on and affixed to the first surface of the substrate, the third conductive trace comprising (i) a first end of the third conductive trace, (ii) a second end of the third conductive trace opposite the first end of the third conductive trace, and (iii) disposed between the first end of the third conductive trace and the second end of the third conductive trace, a first serpentine section of the third conductive trace extending along a serpentine path;
   a first light-emitting element having first and second distinct contacts on a first surface of the first light-emitting element, the first and second contacts being attached to and in electrical contact with, respectively, the first end of the first conductive trace and the second end of the second conductive trace; and
   a second light-emitting element (i) electrically connected in series with the first light-emitting element, and (ii) having third and fourth distinct contacts on a first surface of the second light-emitting element, the third and fourth contacts being attached to and in electrical contact with, respectively, the first end of the second conductive trace and the second end of the third conductive trace,
   wherein:
   the first end of the first conductive trace comprises a plurality of spaced-apart protrusions,
   the second end of the first conductive trace comprises a plurality of spaced-apart protrusions, and
   a length of the protrusions of the first end of the first conductive trace is greater than a length of the protrusions of the second end of the first conductive trace.

2. The electronic device of claim 1, wherein:
   the first end of the second conductive trace comprises a plurality of spaced-apart protrusions,
   the second end of the second conductive trace comprises a plurality of spaced-apart protrusions, and
   a length of the protrusions of the first end of the second conductive trace is greater than a length of the protrusions of the second end of the second conductive trace.

3. The electronic device of claim 2, wherein:
   the length of the protrusions of the first end of the first conductive trace is substantially equal to the length of the protrusions of the first end of the second conductive trace, and
   the length of the protrusions of the second end of the first conductive trace is substantially equal to the length of the protrusions of the second end of the second conductive trace.

4. An electronic device comprising:
   a flexible substrate;
   a first conductive trace disposed on and affixed to a first surface of the substrate, the first conductive trace comprising (i) a first end of the first conductive trace, (ii) a second end of the first conductive trace opposite the first end of the first conductive trace, and (iii) disposed between the first end of the first conductive trace and the second end of the first conductive trace, a first serpentine section of the first conductive trace extending along a serpentine path;
   extending substantially collinearly with the first conductive trace, a second conductive trace disposed on and affixed to the first surface of the substrate, the second conductive trace comprising (i) a first end of the second conductive trace, (ii) a second end of the second conductive trace opposite the first end of the second conductive trace, and (iii) disposed between the first end of the second conductive trace and the second end of the second conductive trace, a first serpentine section of the second conductive trace extending along a serpentine path;
   extending substantially collinearly with the first and second conductive traces, a third conductive trace disposed on and affixed to the first surface of the substrate, the third conductive trace comprising (i) a first end of the third conductive trace, (ii) a second end of the third conductive trace opposite the first end of the third conductive trace, and (iii) disposed between the first end of the third conductive trace and the second end of the third conductive trace, a first serpentine section of the third conductive trace extending along a serpentine path;
   a first light-emitting element having first and second distinct contacts on a first surface of the first light-emitting element, the first and second contacts being attached to and in electrical contact with, respectively, the first end of the first conductive trace and the second end of the second conductive trace; and
   a second light-emitting element (i) electrically connected in series with the first light-emitting element, and (ii) having third and fourth distinct contacts on a first surface of the second light-emitting element, the third and fourth contacts being attached to and in electrical contact with, respectively, the first end of the second conductive trace and the second end of the third conductive trace,
   wherein:
   the first end of the first conductive trace comprises a plurality of spaced-apart protrusions, a gap being defined between two of the protrusions, and
   a width of the gap varies in a direction toward the second conductive trace.

5. The electronic device of claim 4, wherein the width of the gap increases in the direction toward the second conductive trace.

6. An electronic device comprising:
   a flexible substrate;
   a first conductive trace disposed on and affixed to a first surface of the substrate, the first conductive trace comprising (i) a first end of the first conductive trace, (ii) a second end of the first conductive trace opposite the first end of the first conductive trace, and (iii) disposed between the first end of the first conductive trace and the second end of the first conductive trace, a first serpentine section of the first conductive trace extending along a serpentine path;

extending substantially collinearly with the first conductive trace, a second conductive trace disposed on and affixed to the first surface of the substrate, the second conductive trace comprising (i) a first end of the second conductive trace, (ii) a second end of the second conductive trace opposite the first end of the second conductive trace, and (iii) disposed between the first end of the second conductive trace and the second end of the second conductive trace, a first serpentine section of the second conductive trace extending along a serpentine path;

extending substantially collinearly with the first and second conductive traces, a third conductive trace disposed on and affixed to the first surface of the substrate, the third conductive trace comprising (i) a first end of the third conductive trace, (ii) a second end of the third conductive trace opposite the first end of the third conductive trace, and (iii) disposed between the first end of the third conductive trace and the second end of the third conductive trace, a first serpentine section of the third conductive trace extending along a serpentine path;

a first light-emitting element having first and second distinct contacts on a first surface of the first light-emitting element, the first and second contacts being attached to and in electrical contact with, respectively, the first end of the first conductive trace and the second end of the second conductive trace; and a second light-emitting element (i) electrically connected in series with the first light-emitting element, and (ii) having third and fourth distinct contacts on a first surface of the second light-emitting element, the third and fourth contacts being attached to and in electrical contact with, respectively, the first end of the second conductive trace and the second end of the third conductive trace, wherein:

the first end of the first conductive trace comprises a plurality of spaced-apart protrusions extending in a first direction, and the second end of the first conductive trace comprises a plurality of spaced-apart protrusions extending in a second direction opposite the first direction.

7. The electronic device of claim 6, wherein:

the first surface of the first light-emitting element is substantially rectangular with a long axis, and the first light-emitting element is oriented such that the long axis of the first surface of the first light-emitting element is substantially parallel to the first and second directions.

8. The electronic device of claim 6, wherein:

the first surface of the first light-emitting element is substantially rectangular with a long axis, and the first light-emitting element is oriented such that the long axis of the first surface of the first light-emitting element is substantially perpendicular to the first and second directions.

9. An electronic device comprising;

a flexible substrate;

a first conductive trace disposed on and affixed to a first surface of the substrate, the first conductive trace comprising (i) a first end of the first conductive trace, (ii) a second end of the first conductive trace opposite the first end of the first conductive trace, and (iii) disposed between the first end of the first conductive trace and the second end of the first conductive trace, a first serpentine section of the first conductive trace extending along a serpentine path;

extending substantially collinearly with the first conductive trace, a second conductive trace disposed on and affixed to the first surface of the substrate, the second conductive trace comprising (i) a first end of the second conductive trace, (ii) a second end of the second conductive trace opposite the first end of the second conductive trace, and (iii) disposed between the first end of the second conductive trace and the second end of the second conductive trace, a first serpentine section of the second conductive trace extending along a serpentine path;

extending substantially collinearly with the first and second conductive traces, a third conductive trace disposed on and affixed to the first surface of the substrate, the third conductive trace comprising (i) a first end of the third conductive trace, (ii) a second end of the third conductive trace opposite the first end of the third conductive trace, and (iii) disposed between the first end of the third conductive trace and the second end of the third conductive trace, a first serpentine section of the third conductive trace extending along a serpentine path;

a first light-emitting element having first and second distinct contacts on a first surface of the first light-emitting element, the first and second contacts being attached to and in electrical contact with, respectively, the first end of the first conductive trace and the second end of the second conductive trace;

a second light-emitting element (i) electrically connected in series with the first light-emitting element, and (ii) having third and fourth distinct contacts on a first surface of the second light-emitting element, the third and fourth contacts being attached to and in electrical contact with, respectively, the first end of the second conductive trace and the second end of the third conductive trace; and a stiffener, distinct from the substrate and spanning at least a portion of the region between the first end of the first conductive trace and the second end of the second conductive trace, the stiffener being configured to substantially prevent flexing of the substrate at the region between the first end of the first conductive trace and the second end of the second conductive trace during flexing of the substrate.

10. The electronic device of claim 9, wherein the stiffener is substantially transparent to a wavelength of light emitted by the first light-emitting element.

11. The electronic device of claim 9, wherein the stiffener comprises a layer disposed over at least a portion of the first surface of the substrate.

12. The electronic device of claim 11, wherein the stiffener is disposed over at least a portion of at least one of the first conductive trace or the second conductive trace.

13. The electronic device of claim 11, wherein the stiffener covers an entirety of the first light-emitting element and is in contact with, proximate the first light-emitting element, at least one of (i) the substrate, (ii) the first conductive trace, or (iii) the second conductive trace.

14. The electronic device of claim 9, wherein the stiffener comprises a layer disposed over a second surface of the substrate opposite the first surface of the substrate.

15. An electronic device comprising:

a flexible substrate;

a first conductive trace disposed on and affixed to a first surface of the substrate, the first conductive trace comprising (i) a first end of the first conductive trace, (ii) a second end of the first conductive trace opposite the first end of the first conductive trace, and (iii) disposed between the first end of the first conductive trace and the second end of the first conductive trace, a first serpentine section of the first conductive trace extending along a serpentine path;

extending substantially collinearly with the first conductive trace, a second conductive trace disposed on and affixed to the first surface of the substrate, the second conductive trace comprising (i) a first end of the second conductive trace, (ii) a second end of the second conductive trace opposite the first end of the second conductive trace, and (iii) disposed between the first end of the second conductive trace and the second end of the second conductive trace, a first serpentine section of the second conductive trace extending along a serpentine path;

extending substantially collinearly with the first and second conductive traces, a third conductive trace disposed on and affixed to the first surface of the substrate, the third conductive trace comprising (i) a first end of the third conductive trace, (ii) a second end of the third conductive trace opposite the first end of the third conductive trace, and (iii) disposed between the first end of the third conductive trace and the second end of the third conductive trace, a first serpentine section of the third conductive trace extending along a serpentine path;

a first light-emitting element having first and second distinct contacts on a first surface of the first light-emitting element, the first and second contacts being attached to and in electrical contact with, respectively, the first end of the first conductive trace and the second end of the second conductive trace; and a second light-emitting element (i) electrically connected in series with the first light-emitting element, and (ii) having third and fourth distinct contacts on a first surface of the second light-emitting element, the third and fourth contacts being attached to and in electrical contact with, respectively, the first end of the second conductive trace and the second end of the third conductive trace, wherein (i) the first light-emitting element is part of one of a plurality of light-emitting strings disposed on the first surface of the substrate and interconnected in an electric circuit, each light-emitting string comprising (a) a plurality of light-emitting elements spaced along the light-emitting string and (b) a plurality of electrical conductors interconnecting the light-emitting elements, (ii) the electric circuit comprises at least one passive component, (iii) at least one said passive component of the electric circuit is a distributed component having a target resistance in response to current passing therethrough, and (iv) the distributed component is a resistor consisting essentially of a first portion of a first electrical conductor and having at least one of (a) a thickness different from a thickness of a second portion of the first electrical conductor different from the first portion, the different thickness imparting the target resistance or (b) a width different from a width of a second portion of the first electrical conductor different from the first portion, the different width imparting the target resistance.

* * * * *